United States Patent
Fetzer

(10) Patent No.: US 10,861,992 B2
(45) Date of Patent: Dec. 8, 2020

(54) PEROVSKITE SOLAR CELLS FOR SPACE

(71) Applicant: The Boeing Company, Chicago, IL (US)

(72) Inventor: Christopher M. Fetzer, Los Angeles, CA (US)

(73) Assignee: THE BOEING COMPANY, Chicago, IL (US)

( * ) Notice: Subject to any disclaimer, the term of this patent is extended or adjusted under 35 U.S.C. 154(b) by 673 days.

(21) Appl. No.: 15/361,106

(22) Filed: Nov. 25, 2016

(65) Prior Publication Data

US 2018/0151304 A1     May 31, 2018

(51) Int. Cl.
*H01L 31/043*     (2014.01)
*H01L 31/078*     (2012.01)

(52) U.S. Cl.
CPC .......... *H01L 31/043* (2014.12); *H01L 31/078* (2013.01)

(58) Field of Classification Search
CPC ............................ H01L 31/043; H01L 31/078
See application file for complete search history.

(56) References Cited

U.S. PATENT DOCUMENTS

| | | | |
|---|---|---|---|
| 5,777,356 A | 7/1998 | Dhote et al. | |
| 6,864,414 B2 * | 3/2005 | Sharps | H01L 27/1421 136/249 |
| 7,700,981 B2 | 4/2010 | Goux et al. | |
| 8,748,350 B2 | 6/2014 | Goyal et al. | |
| 8,766,341 B2 | 7/2014 | Han et al. | |
| 9,608,159 B2 | 3/2017 | Chaudhari | |
| 9,812,660 B2 | 11/2017 | Huang et al. | |
| 2002/0195602 A1 | 12/2002 | Klosowiak | |
| 2003/0062553 A1 | 4/2003 | Ramesh et al. | |
| 2005/0217566 A1 | 10/2005 | Mantl et al. | |
| 2007/0007565 A1 | 1/2007 | Goux et al. | |
| 2007/0053139 A1 | 3/2007 | Zhang et al. | |
| 2007/0079987 A1 | 4/2007 | Yamamichi et al. | |
| 2010/0159666 A1 | 6/2010 | Goux et al. | |
| 2012/0032234 A1 | 2/2012 | Wang et al. | |
| 2012/0227663 A1 | 9/2012 | Jha et al. | |
| 2012/0264612 A1 | 10/2012 | Goyal et al. | |
| 2012/0264615 A1 | 10/2012 | Goyal et al. | |
| 2014/0261604 A1 | 9/2014 | Jha et al. | |
| 2015/0340632 A1 | 11/2015 | Etgar | |

(Continued)

FOREIGN PATENT DOCUMENTS

| CN | 104737320 A | * | 6/2015 | ........... H01L 51/005 |
|---|---|---|---|---|
| WO | WO-2016085044 A1 | * | 6/2016 | ......... H01L 31/0687 |
| WO | WO-2017083077 A1 | * | 5/2017 | ....... H01L 31/02167 |

OTHER PUBLICATIONS

Kim et. al., WO 2016085044 A1, English Machine Translation, Jun. 2, 2016.*

(Continued)

*Primary Examiner* — Tae-Sik Kang
(74) *Attorney, Agent, or Firm* — MH2 Technology Law Group LLP

(57) ABSTRACT

Provided is a multijunction photovoltaic device, including: a first subcell and a second subcell. The first cell includes a base semiconductor layer and a second semiconductor layer. The base semiconductor layer includes a Group III-V semiconductor material. The second subcell includes an absorber layer. The absorber layer includes an organometallic halide ionic solid perovskite semiconductor material.

21 Claims, 12 Drawing Sheets

(56) References Cited

U.S. PATENT DOCUMENTS

| | | | |
|---|---|---|---|
| 2016/0035927 A1* | 2/2016 | Gershon | H01L 31/0326 136/244 |
| 2016/0072124 A1 | 3/2016 | Pan et al. | |
| 2016/0079552 A1 | 3/2016 | Su et al. | |
| 2016/0222039 A1 | 8/2016 | Sum et al. | |
| 2016/0248028 A1 | 8/2016 | Huang et al. | |
| 2016/0322167 A1 | 11/2016 | Chaudhari | |
| 2017/0012404 A1 | 1/2017 | Xing et al. | |
| 2017/0098514 A1 | 4/2017 | Geohegan et al. | |
| 2017/0152608 A1 | 6/2017 | Jin et al. | |
| 2017/0186559 A1 | 6/2017 | Zhu et al. | |
| 2017/0229647 A1 | 8/2017 | Qi et al. | |
| 2018/0151301 A1 | 5/2018 | Fetzer et al. | |

OTHER PUBLICATIONS

Etgar et. al., CN 104737320 A, English Machine Translation, Jun. 24, 2015.*

Abbas et al., "High efficiency sequentially vapor grown n-i-p CH3NH3PbI3 perovskite solar cells with undoped P3HT as p-type heterojunction layer", APL Materials, 2015, 8 pages.

Nafradi et al., "Methylammonium Lead Iodide for Efficient X-ray Energy Conversion", The Journal of Physical Chemistry, 2015, pp. 25204-25208.

Albrecht et al., "Monolithic perovskite/silicon-heterojunction tandem solar cells processed at low temperature", Energy Environ. Sci., 2016, 9, pp. 81-88.

Miller, "Unusual defect physics underlies perovskite solar cells' exceptional performance", Citation: Physics Today 67(5), 13 (2014); URL: http://scitation.aip.org/content/aip/magazine/physicstoday/article/67/5/10.1063/PT.3.2368.

Jeon et al., "Compositional engineering of perovskite materials for high-performance solar cells," Letter, Nature, vol. 517, Jan. 22, 2015, 14 pages.

Lund et al., "Properties of lead iodide semiconductor radiation detectors," Nuclear Instruments and Methods in Physics Research A283 (1989, 299-302.

Yang et al., "High-performance photovoltaic perovskite layers fabricated through intramolecular exchange," Solar Cells, vol. 348, Issue 6240, Jun. 12, 2015, 5 pages.

Wikipeida, "Perovskite Solar Cell," on Aug. 6, 2020, downloaded htttps://en.wikipedia.org/wiki/Perovskite_solar_cell 1 page.

Yin et al., "Unusual defect physics in CH3NH3PbI3 perovskite solar cell absorber," Applied Physics Letters, 104, 063903 (2014), 5 pages.

Dong et al., "Electron-hole diffusion lengths > 175 um in solution-grown CH3NH3PBI3 single crystals," Science Mag, Solar Cells, Feb. 27, 2015, vol. 347, issue 6225, pp. 967-970.

Philippe et al., "Chemical and electronic structure characterization of lead halide perovskites and stability behavior under different exposures—a photoelectronic spectroscopy investigation," Chemistry of Materials, 2015, 27, 1720-1731.

Yang et al., "Origin of the thermal instalibilty in CH3NH3PbI3 thin films deposited on ZnO," Chemistry of Materials, 2015, 27, 4229-4236.

Snaith, "Perovskites: The emergence of a new era for low-cost, high-efficiency solar cells," The Journal of Physical Chemistry Letters, 2013, 4, 3623-3630.

Spectrolab, Ultra Triple Junction (UTJ) product sheet, date unknown, downloaded Jul. 27, 2020, 2 pages.

NASA, "GaAs Solar Cell Radiation Handbook," JPL Publication 96-9, Jul. 1, 1996, 22 pages.

Nie et al., "High-efficiency solution-processed perovskite solar cells with millimeter-scale grains", Sciencemag.org, 2015, vol. 347, Issue 6221, pp. 522-525.

Maculan et al., "CH3NH3PbCl3 Single Crystals: Inverse Temperature Crystallization and Visible-Blind UV-Photodetector", The Journal of Physical Chemistry, 2015, pp. 3781-3786.

Wang et al., "Stability of perovskite solar cells", Solar Energy Materials & SolarCells, 147 (2016), pp. 255-275.

* cited by examiner

PEROVSKITE SOLAR CELLS FOR SPACE

FIELD

The subject matter described herein relates generally to optoelectronic semiconductor structures, such as solar cells, photodetectors and the like, which are broadly referred to herein as solar cells. More particularly, this application relates to heterojunction solar cells and methods of making the same.

BACKGROUND

A solar cell is a photovoltaic (PV) device that is capable of converting incident light energy, and specifically solar energy (sunlight), to electrical energy by the photovoltaic effect. The interest in solar cells has been increasing due to concerns regarding pollution, energy security, and limited available resources. This interest has been for both terrestrial and non-terrestrial (space) applications.

In terrestrial applications, higher solar cell efficiency for conversion of sunlight to electricity results in a smaller collecting area required for a given electrical power output, and therefore lower cost per watt, and greater cost effectiveness for a terrestrial photovoltaic system. The cost per watt of electrical power generation capacity of photovoltaic systems inhibits their widespread use in terrestrial applications. The conversion efficiency of sunlight to electricity may be critically important for terrestrial PV systems, since increased efficiency usually results in a reduction of related electricity generation system components (such as cell area, module or collector area, support structures, and land area) for a required power output of the system. For example, in concentrator solar cell systems which concentrate sunlight from around 2 to around 2000 times onto the solar cell, an increase in efficiency typically results in a proportionate reduction of an area comprising expensive concentrating optics.

In space applications, the use of nuclear or battery power greatly increases a spacecraft's payload for a given amount of required power to operate the satellite. Increasing the payload of a spacecraft in this manner increases the cost of a launch more than linearly. With the ready availability of solar energy in space for a spacecraft such as a satellite, the conversion of solar energy into electrical energy has proven to be a good alternative to an increased payload and the development of higher efficiency solar cells enables further increased payload capabilities.

To increase their electrical power output, solar cells may have one or more photovoltaic junctions (multijunction), which are one or more component photovoltaic cells and are also called subcells. The subcell/junction may include corresponding photovoltaic semiconductor layers having different energy bandgaps and may be stacked so that each subcell can absorb a different part of the wide energy distribution in the sunlight. Incident light energy of different ranges of wavelengths may be converted at a corresponding one or more of the junctions.

These component photovoltaic cells, or subcells, may be connected in series to form a multijunction solar cell, but may also be connected in other electrical configurations, such as in parallel, or in a combination of series and parallel connections. The stacked multijunction arrangement is advantageous, since each photon absorbed in a subcell corresponds to one unit of charge that is collected at the subcell operating voltage, which is approximately linearly dependent upon the bandgap of the semiconductor material of the subcell. Since the output power is the product of voltage and current, an ideally efficient solar cell would have a large number of subcells, each absorbing only photons of energy negligibly greater than its bandgap.

In multijunction solar cells it is often desirable to modify the bandgaps of the semiconductor layers that form the subcells within the multijunction cell, and thereby modify the subcell voltages and wavelength ranges over which the subcells respond to incident light, for instance, to space and terrestrial solar spectra. The specific bandgaps and thicknesses of layers that form the subcells within a multijunction cell determine the subcell voltages, the current densities of each subcell, whether the subcell current densities can be matched to one another as is desired in a series-interconnected multijunction cell, and how the broad solar spectrum is divided into narrower wavelength ranges by the combination of subcell bandgaps to achieve higher sunlight-to-electricity conversion. A crucial technological challenge in the design of multijunction solar cells is how to achieve the optimum or near-optimum combination of subcell layer bandgaps, and how to achieve the desired wavelength ranges of subcell response—the wavelength ranges in which the subcells have photogenerated current that can be collected usefully—in order to maximize the multijunction solar cell efficiency. Often the semiconductors that are readily useable—e.g., semiconductors that are lattice-matched to relatively common, inexpensive substrates; that can be grown with favorable minority-carrier properties such as lifetime and mobility; or that do not cause unwanted doping or impurities in other parts of the cell—do not have the bandgaps that result in the most favorable combination of multijunction subcell bandgaps for conversion of the solar spectrum.

The most efficient and, therefore, dominant multijunction (MJ) PV cell technology is the GaInP/Ga(In)As/Ge cell structure. Here the use of parentheses in the Ga(In)As middle subcell material indicates that the incorporation of indium in the middle cell is optional, so that the composition of the middle cell may be either GaAs or GaInAs. These monolithic cells may be grown lattice-matched to GaAs or Ge, and may have only the top two junctions active with an inactive Ge substrate (2-junction or 2J cells), or all three junctions may be active (3-junction or 3J cells). While variations on this material system, such as AlGaInP or lattice-mismatched GaInP top cells, might provide a more ideal match of bandgaps to the solar spectrum, practical considerations have indicated that lattice-matched GaInP is preferred for large-scale production.

Traditionally, the current generated by each subcell was controlled by reducing the subcell voltage. Specifically, the alloy composition of the base semiconductor layer of the subcell was engineered to yield the desired amount of current. For example, lower bandgap alloys have been used in the base semiconductor layer to achieve a higher current output at the expense of a lower output voltage for the subcell. In monolithic, series-interconnected, 2-junction and 3-junction GaInP/Ga(In)As/Ge solar cells, it is desirable for the GaInP top subcell to have nearly the same photogenerated current density as the Ga(In)As subcell. If the currents are different, the subcell with the lowest photogenerated current will limit the current through all of the series-interconnected subcells in MJ cell, and excess photogenerated current in other subcells is wasted. Limiting the current in this manner results in a severe penalty on the MJ cell efficiency. However, one potential approach to improving the existing triple-junction GaInP/Ga(In)As/Ge multijunction solar cell device is to add one or more additional junctions.

The power conversion efficiency of a subcell is a function of both the output voltage and the output current. Therefore, an approach for current matching the subcells of a solar cell is by altering the chemical composition of the base semiconductor layer.

Recent progress in dye-sensitized solar cells (DSSC) has produced a novel material category for solar power conversion. The combined organic-metal halide formed in perovskite crystal and deposited at low temperature as a polycrystalline layer has achieved a pathway to low cost, high efficiency solar power conversion. Recent reporting indicates a lab measured 20.1% efficiency under terrestrial standard conditions (AM1.5G, 25° C.), rivaling efficiencies of standard silicon wafer based technologies. With the grand increase in efficiency, the research improvements have increased immensely and the field is evolving rapidly. And with each reported new record, some consistent issues are appearing with the materials. Many limitations, new materials and device engineering challenges are being elucidated. For example, overcoming issues related to radiation tolerance, e.g., resistance of new materials to UV damage, without sacrificing device performance or increasing cost is of particular interest. Improved multijunction solar (photovoltaic) cells and methods for making the same would be welcome additions to the art.

SUMMARY

In an example, there is a multijunction photovoltaic device, including: a first subcell and a second subcell. The first cell includes a base semiconductor layer and a second semiconductor layer. The base semiconductor layer includes a Group III-V semiconductor material. The second subcell includes an absorber layer. The absorber layer includes an organometallic halide ionic solid perovskite semiconductor material.

In an example, there is a photovoltaic device comprising: at least one layer comprising an organometallic halide ionic solid perovskite semiconductor material and at least one layer comprising a Group III-V semiconductor material. The organometallic halide ionic solid perovskite is represented by the formula, $ABX_3$, where A comprises an organic ion, B comprises a group-IV ion, and X comprises a halide ion. The organic ion comprises methylammonium (MA), formamidine (FA), at least one alkali metal, or combinations thereof, wherein the alkali metal may comprise cesium (Cs), rubidium (Rb) or both. The group-IV ion comprises $Pb^+$, $Sn^+$, or a combination thereof and the halide ion may comprise $Cl^-$, $Br^-$, $I^-$, or combinations thereof.

In an example, there is a method for forming a multijunction photovoltaic device, comprising: forming a first subcell comprising a base semiconductor layer and a second semiconductor layer, wherein the base semiconductor layer comprises a Group III-V semiconductor material; and forming a second subcell comprising an absorber layer, wherein the absorber layer comprises an organometallic halide ionic solid perovskite semiconductor material.

Advantages of the examples will be set forth in part in the description which follows, and in part will be understood from the description, or may be learned by practice of the examples. The advantages will be realized and attained by means of the elements and combinations particularly pointed out in the appended claims.

It is to be understood that both the foregoing general description and the following detailed description are exemplary and explanatory only and are not restrictive of the examples, as claimed.

BRIEF DESCRIPTION OF THE DRAWINGS

The accompanying drawings, which are incorporated in and constitute a part of this specification, illustrate examples of the present teachings and together with the description, serve to explain the principles of the disclosure.

DETAILED DESCRIPTION

Figure 1B:
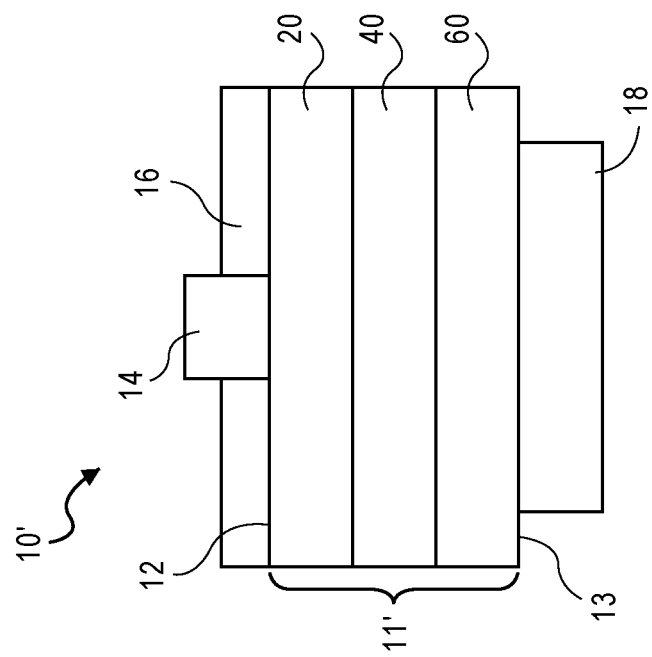
FIG. 1B is a cross-sectional view of one aspect of the disclosed solar cell structure.

Reference will now be made in detail to the examples which are illustrated in the accompanying drawings. Wherever possible, the same reference numbers will be used throughout the drawings to refer to the same or like parts.

Notwithstanding that the numerical ranges and parameters setting forth the broad scope of the examples are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." Additionally, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "at least one of" is used to mean one or more of the listed items may be selected. As used herein, the phrase "one or more of", for example, A, B, and C means any of the following: either A, B, or C alone; or combinations of two, such as A and B, B and C, and A and C; or combinations of three A, B and C.

As used herein, the terms "doped" or "doping" (and variants thereof), as it pertains to semiconductor material or layers comprising semiconductor material, refers to the introduction of or presence of impurity "dopant" elements that are deliberately added to, for example, extrinsic semiconductors, so as to induce a change in the inherent electrical conductivity of the semiconductor material.

As understood to those of ordinary skill in the semiconductor art, the "type" of dopant describes the relative amount of valence electrons of impurity atoms as compared to the atoms of the semiconductor they exist in or are introduced to. That is, p-type dopants have fewer valence and n-type dopants having more valence electrons than the semiconductor. In common usage, the notation "p-doped" indicates that a semiconductor has been doped with p-type dopants so as to increase the number of positive charge carriers relative to the number of negative charge carriers in the semiconductor, and "n-doped" indicates that a semiconductor has been doped with n-type dopants so as to increase the number of negative charge carriers relative to positive charge carriers in the semiconductor.

As understood to those of ordinary skill in the semiconductor art, the "level" of dopant describes the concentration of the dopant impurity in the semiconductor. For example, as used herein, "lightly doped" indicates that the level of doping is about $10^{14}$ to about $10^{15}$ dopant atoms/cm$^3$, "medium doped" indicates that the level of doping is about $10^{16}$ to about $10^{17}$ dopant atoms/cm$^3$, and "heavily doped" indicates that the level of doping is about $10^{18}$ to about $10^{19}$ dopant atoms/cm$^3$. Accordingly, as used herein, the notation "p$^+$" or "n$^+$" indicates that a corresponding semiconductor is medium doped p-type or n-type, respectively, and "doped and "p$^{++}$" or "n$^{++}$" indicates that a corresponding semiconductor is heavily doped p-type or n-type, respectively.

The following examples are described for illustrative purposes only with reference to the Figures. Those of skill in the art will appreciate that the following description is exemplary in nature, and that various modifications to the parameters set forth herein could be made without departing from the scope of the present examples. It is intended that the specification and examples be considered as exemplary only. The various examples are not necessarily mutually exclusive, as some examples can be combined with one or more other examples to form new examples. It will be understood that the structures depicted in the figures may include additional features not depicted for simplicity, while depicted structures may be removed or modified.

Generally described herein are solar cells, including multijunction solar cells, that utilize at least one III-V semiconductor layer and at least one perovskite material layer, these layers disposed within one subcell and/or disposed in different subcells of the same multijunction photovoltaic device for improved current densities. In one implementation, the III-V semiconductor layer(s) are configured to act as an absorber/attenuator of ultraviolet (UV) light in order to minimize or prevent any damage to the perovskite material layer. More specifically, described herein are high-efficiency multijunction photovoltaic cells that may be used with, for example, a satellite and manned or unmanned spacecraft and space probes. In one approach, the weakest junction under radiation effects (e.g., a GaAs subcell) in a GaInP/GaAs/Ge 3-junction photovoltaic device may be replaced with a perovskite subcell (e.g., GaInP/Perovskite/Ge) to improve overall radiation tolerance.

In radiation performance of conventional solar cells, such as III-V and IV solar cells, two key physical properties contribute to the solar cells performance retention: first, the amount of damage the material receives in terms of defects created in the material per ionizing particle; and second, the location of the defect in the energy gap and hence the efficacy of the defect to act as non-radiative recombination site. Accordingly, solar cells described herein utilize organo-lead halide materials as these materials have shown superior performance over conventional solar cell materials.

For example, the amount of damage a material receives from a radiation particle—e.g., displacement of atoms from the lattice—is proportional to the mass of the atoms. In GaAs, both Ga and As are typically displaced from the lattice with high-energy electrons and proton radiation from elastic collisions known as displacement damage. While not limited to any particular theory, it is believed that because the central atoms and ions that make up perovskite materials have greater mass than the constituent atoms of, for example, Ga and As in conventional III-V photovoltaic device subcells, the displacement damage caused by such particle radiation will be reduced in comparison between the perovskite and GaAs materials. Thus, it is believed that the perovskite material should exhibit fewer centers than an equivalent GaAs solar cell given the same radiation dose.

Additionally, in photovoltaic devices, the bandgap energy of the recombination region controls photon absorption. However, energy states introduced through defects in the crystal lattice of perovskite materials are known to be outside this bandgap. Specifically, defects in organo lead iodide perovskites at grain boundaries do not produce effective non-radiative recombination centers. Thus, while not limited to any particular theory, it is believed that for perovskite subcells in photovoltaic devices such as in a space radiation environment application—i.e., solar cells used in space—even when defects are created by particle radiation, they will be ineffective as recombination sites. Accordingly, it is further believed that perovskite solar cells will be only lightly affected by space radiation.

Multifunction Photovoltaic Devices

Figure 1A:
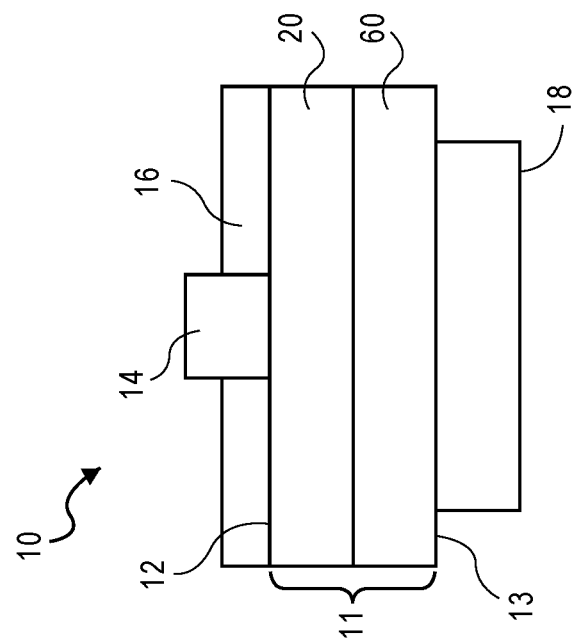
FIG. 1A is a cross-sectional view of one aspect of the disclosed solar cell structure.

Referring to FIGS. 1A-1B, aspects of a photovoltaic device are illustrated as solar cell structure 10 and solar cell structure 10'. Solar cell structure 10 includes a solar cell 11, and solar cell structure 10' includes a solar cell 11'. Each of solar cell structures 10 and 10' may include a first (front or top) contact layer 14, an anti-reflective coating layer 16 (hereinafter "AR coating layer") and/or a second (back or bottom) contact layer 18. The first contact layer 14 and the AR coating layer 16 may be positioned over the front surface 12 of the solar cell structures 10, 10' and the second contact layer 18 may be positioned over the back surface 13 of the solar cells 11 and 11'. When front surface 12 is exposed to electro-magnetic radiation, such as solar radiation, the solar cells 11 and 11' may produce a voltage across their respective front surface 12 and the back surface 13.

The solar cells 11 and 11' may include one or more subcells; i.e., solar cells 11 and 11' may comprise multijunction solar cells. The subcells may be referred to by the order in which light strikes each subcell as it enters the front surface 12 of the solar cell structure 10 or solar cell structure 10'. For instance in FIGS. 1A-1B, a frontside subcell (adjacent to front surface 12) may also be referred to as the top subcell 20, a backside subcell (adjacent to back surface 13) may also be referred to as bottom subcell 60. In the case of solar cell structure 10', the subcell between top subcell 20 and bottom subcell 60 may be referred to as the middle subcell 40. In general, a cell structure may have n subcells that may be electrically connected in series, where n may be equal to 1 for a single-junction cell, or n may be any integer greater than or equal to 2 for a multijunction cell.

One or more tunnel junctions may connect the subcells. For example, in one implementation of a multijunction solar cell, one or more tunnel junctions may be disposed between top subcell 20 and the middle subcell 40 to connect the subcells in electrical series. In an implementation, one or more tunnel junctions may be disposed between the middle subcell 40 and the bottom subcell 60 to connect the subcells in electrical series. In general, each of the n subcells in a multijunction photovoltaic cell, such as solar cell structures 10 and 10' in FIGS. 1A and 1B, respectively, may be connected in series to the adjacent subcell(s) by one or more tunnel junctions in order to form a monolithic, two-terminal, series-interconnected multijunction cell. In a two-terminal configuration it can be desirable to design the subcell thicknesses and bandgaps such that each subcell has nearly the same current at the maximum power point of the current-voltage curve of each subcell, in order that one subcell does not severely limit the current of the other subcells. Alternatively, the subcells may be contacted by means of additional terminals, for instance, metal contacts to laterally conductive semiconductor layers between the subcells, to form 3-terminal, 4-terminal, and in general, m-terminal multijunction cells (m being an integer greater than or equal to 2, and less than or equal to 2n, where n is the number of active subcells in the solar cell structure). The subcells can be interconnected in circuits using these additional terminals such that most of the available photogenerated current density in each subcell can be used effectively. Such effective use may lead to high efficiency for the multijunction cell, even if the photogenerated current densities are very different in the various subcells.

The one or more subcells may comprise the same or different substructures based, in part, on their locations in the solar cell structures 10, 10' of FIGS. 1A-1B, for example, depending on their configurations as the top subcell 20, the at least one middle subcell 40, or the bottom subcell 60.

In one implementation of a solar cell structure 10, for example, comprising a multijunction solar cell structure, solar cell 11 includes a first subcell and a second subcell. The first subcell includes a base semiconductor layer and another semiconductor layer. The base semiconductor layer comprises a p-type semiconductor, such as a p-type group III-V semiconductor material, and the other semiconductor layer may comprise an emitter semiconductor layer which may comprise an n-type semiconductor material. The second subcell includes an absorber layer, wherein the absorber layer comprises an organometallic halide ionic solid perovskite semiconductor material. Generally, the organometallic halide ionic solid perovskite semiconductor material of the absorber layer may be represented by the formula, $ABX_3$, where A comprises an organic ion, B comprises a group-IV ion, and X comprises a halide ion. The organic ion may comprise methylammonium (MA), formamidine (FA), at least one alkali metal, or combinations thereof, wherein the alkali metal may comprise cesium (Cs), rubidium (Rb) or both. The group-IV ion may comprise $Pb^+$, $Sn^+$, or a combination thereof and the halide ion may comprise $Cl^-$, $Br^-$, $I^-$, or combinations thereof. In an example, the organometallic halide ionic solid perovskite of the absorber layer of the second subcell may comprise methylammonium lead iodide ($CH_3NH_3PbI_3$), methylammonium lead bromide ($CH_3NH_3PbBr_3$), methylammonium lead chloride ($CH_3NH_3PbCl_3$), methylammonium tin bromide ($CH_3NH_3SnI_3$), methylammonium tin bromide ($CH_3NH_3SnBr_3$), formamidinium lead iodide ($NH_2CH=NH_2PbI_3$), or mixtures thereof. Generally, n-type materials need to have a Valence Band Level (Ev) that is lower than the absorber layer comprising the perovskite as this limits the injection of the minority carrier holes into the emitter.

In some implementations, the solar cell structure 10 comprises a 2-junction solar cell structure such as that in FIG. 1A. In a first implementation of a 2-junction solar cell structure, the first subcell comprising the III-V semiconductor material in the base semiconductor layer may be configured as a top subcell, such as top subcell 20. Accordingly, the second subcell comprising the organometallic halide ionic solid perovskite semiconductor material in the absorber layer may be configured as a bottom subcell, such as bottom subcell 60.

Perovskite materials may be susceptible to UV light. A UV absorbing layer may be placed between the organometallic halide ionic solid perovskite semiconductor material and the source of the electromagnetic energy comprising UV light. This positioning allows from some to all of UV light reaching the device to be absorbed within a subcell comprising a UV-absorbing active layer and minimizes or prevents the UV light to penetrate and/or degrade the perovskite layer. Accordingly, in an expression of the first implementation, the III-V semiconductor may be selected to absorb UV-light and serves as a UV-protectant for the perovskite of the bottom subcell. Thus, a bandgap of the base semiconductor may be larger than the bandgap of the organometallic halide ionic solid perovskite. In a second implementation of a 2-junction solar cell structure, the second subcell comprising the organometallic halide ionic solid perovskite semiconductor material in the absorber layer may be configured as a top subcell such as top subcell 20. In an expression of the second implementation of the 2-junction solar cell, a bandgap of the base semiconductor may be smaller than the bandgap of the organometallic halide ionic solid perovskite.

In some implementations, the solar cell structure 10' comprises a 3-junction solar cell structure such as that in FIG. 1B. The 3-junction solar cell structure 10' is similar to solar cell structure 10 from FIG. 1A but its solar cell 11' includes an additional third subcell as a middle subcell 40.

In a first implementation of a 3-junction solar cell, the second subcell comprising the organometallic halide ionic solid perovskite semiconductor material in the absorber layer may be configured as a top subcell such as top subcell 20. The third subcell may be configured as a bottom subcell, such as bottom subcell 60. Accordingly, the first subcell comprising the III-V semiconductor material in the base semiconductor layer may be configured as a middle subcell, such as middle subcell 40. In an expression of the first implementation of the 3-junction solar cell, a bandgap of the base semiconductor may be larger than a bandgap of the organometallic halide ionic solid perovskite.

Additional layers, while not shown in FIG. 1A or 1B, may be included without departing from the scope of the present disclosure. For example, a conventional characteristic of PV cells has been the use of a window layer on an emitter layer disposed on the base of the PV cell. The primary function of the window layer is to reduce minority-carrier recombination (i.e., to passivate) the front surface of the emitter. Additionally, the optical properties of the window material must be such that as much light as possible is transmitted to lower cell layers where the photogenerated charge carriers can be collected more efficiently, or if there is substantial light absorption in the window, the minority-carrier lifetime in the window must be sufficiently long for the carriers to be collected efficiently at the p-n junction between the emitter and base of the PV cell. Similarly, a back-surface field (BSF) structure below the PV cell base has been used to reduce minority-carrier recombination at the back surface of the base. As for the window, the BSF structure must have optical properties which allow most of the light that can be used by the subcells beneath the BSF to be transmitted by the BSF, and/or the minority-carrier properties in the BSF must be such that electrons and holes which are generated by light absorption in the BSF are efficiently collected at the p-n junction of the PV cell.

Additionally, in perovskite cells, the use of buffer layer and/or a hole transport material (HTM) layer allow electrons or holes to pass from perovskite absorber layer and block the opposite carrier. This arrangement forces one way (diode) behavior. The n-side buffer layer and the HTM layer in a perovskite subcell may each comprise corresponding bandgap values that are greater than or equal to that of the perovskite layer. If formed adjacent to the perovskite layer, the HTM layer may have valence band energy (Ev) substantially equal to an Ev of the perovskite layer. If formed adjacent to the perovskite layer, the n-side buffer layer interface may have conduction band energy (Ec) substantially equal to an Ec of the perovskite layer.

The bottom subcell 60 may be disposed on a growth substrate. The growth substrate may be electrically inactive (e.g., as in the case of the multijunction photovoltaic devices of FIGS. 5 and 8), or, it may be electrically active, thereby forming one of the n subcells in the multijunction photovoltaic device (e.g., as in the case of the multijunction photovoltaic devices of FIGS. 4, 6, 9 and 10). Additional layers such as a support layer, a reflective layer and/or a cover glass layer may be additionally included in the solar cell structure 10.

Several variations of photoactive substructures are available for use as subcells in solar cell structures, such as the structures 10 and 10' of FIGS. 1A-1B. Some examples of such substructures are depicted as subcells 30, 50, 70, 80 and 90 in FIGS. 2A, 2B, 2C, 2D and 2E, respectively.

Emitter-Base Subcell 30

Figure 2A:
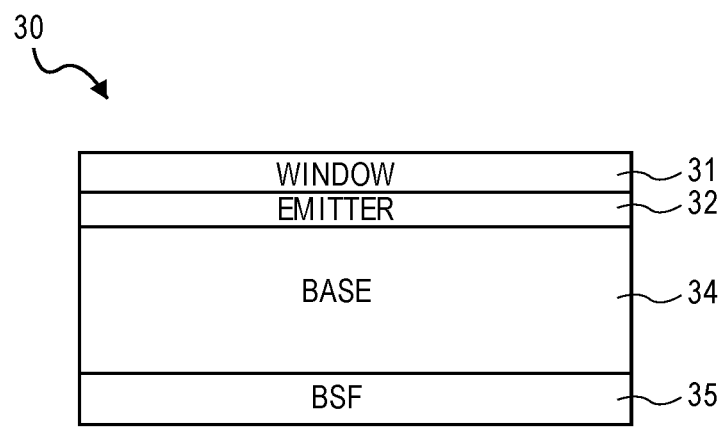
FIG. 2A is a cross-sectional view of a subcell that may be incorporated in one aspect of the disclose solar cell structure.

In an example depicted as FIG. 2A, an emitter-base subcell 30 may include a base semiconductor layer 34 and a second semiconductor layer, such as an emitter semiconductor layer 32, positioned over the base semiconductor layer 34. The base semiconductor layer and the emitter semiconductor layer may be configured to form a p-n junction. Optionally, the emitter-base subcell 30 may also include a window layer 31 positioned over the emitter semiconductor layer 32 and a back surface field (BSF) layer 35 positioned over the base semiconductor layer 34. Other components and layers may also be included in emitter-base subcell 30 without departing from the scope of the present disclosure. The base semiconductor layer 34 and the emitter semiconductor 32 may be disposed adjacent to one another, for example in direct contact with one another. Alternatively, base semiconductor layer 34 and the emitter semiconductor 32 may be separated by one or more additional layers.

Base Semiconductor Layer 34

The base semiconductor layer 34 may include a semiconductor material having a bandgap, a polarity, and a cross-sectional thickness. The semiconductor material of the base semiconductor layer 34 may be any appropriate semiconductor material, for example, based on the location of emitter-base subcell 30 in a multijunction solar cell. In one implementation, the semiconductor material may be a Group III-V metal or metal alloy. For example, the semiconductor material may include a Group III-V alloy, comprising AlAs, AlGaAs, GaAs, GaAsP AlGaInAs, GaInAs, AlGaAsSb, GaInAsSb, or combinations thereof.

The polarity of the base semiconductor layer 34 may be either positive (i.e., p-type) or negative (i.e., n-type). In one example, the base semiconductor layer 34 may be lightly or medium doped as a p-type semiconductor. In another example, the base semiconductor layer 34 may be lightly or medium doped as an n-type semiconductor. As described above, the base semiconductor layer 34 and emitter semiconductor layer 32 may be configured to form a p-n junction. Thus, in implementations, the base semiconductor layer 34 may be at least one p-type version of the III-V materials.

The cross-sectional thickness of the base semiconductor layer 34 may depend on various factors, including the composition of the base semiconductor layer 34. As a general example, the base semiconductor layer 34 may have a cross-sectional thickness ranging from about 0.1 to about 10 microns. As a specific example, the base semiconductor layer 34 may have a cross-sectional thickness of about 1 micron. In one realization, the base semiconductor layer 34 may define a plane and the cross-sectional thickness may be measured perpendicular to that plane.

Emitter Semiconductor Layer 32

The emitter semiconductor layer 32 includes a semiconductor material having a bandgap, a polarity, and a cross-sectional thickness. A bandgap of the emitter semiconductor layer 32 may be from about 1.4 eV to about 2.0 eV, such as about 1.9 eV.

The bandgap of the emitter semiconductor layer 32 may be the same or different than the bandgap of the base semiconductor layer 34. In a first implementation, the semiconductor material of the emitter semiconductor layer 32 may have substantially the same chemical composition as the semiconductor material of the base semiconductor layer 34 (i.e., the semiconductor materials of emitter semiconductor layer 32 and base semiconductor layer 34 may be the same except for the presence of different dopants or different quantities of dopants). Therefore, in an expression of the first implementation, the bandgap of the emitter semiconductor layer 32 may be substantially the same as the bandgap of the base semiconductor layer 34 (i.e., the first and second bandgaps may be substantially the same). In an expression of the first implementation, despite being formed from substantially the same materials, the bandgap of the emitter semiconductor layer 32 may be different than the bandgap of the base semiconductor layer 34 (i.e., the first and second bandgaps may be different) as a result of bandgap engineering, such as varying the local composition of the semiconductor material, introducing different concentrations of electrically active impurities, inducing different levels of strain in the resulting layers as known in the art. As one example, the bandgap of the emitter semiconductor layer 32 may be greater than the bandgap of the base semiconductor layer 34. As another example, the bandgap of the emitter semiconductor layer 32 may be smaller than the bandgap of the base semiconductor layer 34. Such configurations provide for optimizing device performance by allowing or blocking charge carriers from entering or leaving the different layers of the device.

In a second implementation, the semiconductor material of the emitter semiconductor layer 32 may have a different chemical composition than the semiconductor material of the base semiconductor layer 34 (i.e., the first and second semiconductor materials may be different). Therefore, in one expression of the second implementation, the bandgap of the emitter semiconductor layer 32 may be different than the bandgap of the base semiconductor layer 34 (i.e., the first and second bandgaps may be different). As one example, the compositions of the emitter semiconductor layer 32 and the base semiconductor layer 34 may be engineered to provide the base semiconductor layer 34 with a wider bandgap than a bandgap of the emitter semiconductor layer 32. As another example, the compositions of the emitter semiconductor layer 32 and the base semiconductor layer 34 may be engineered by known methods, for example, doping, to provide the emitter semiconductor layer 32 with a greater bandgap than the base semiconductor layer 34.

As described above, the base semiconductor layer 34 and emitter semiconductor layer 32 may be configured to form a p-n junction. Thus, whether or not the base semiconductor layer 34 and the emitter semiconductor layer 32 have the same or different chemical compositions, the layers 32, 34 may be doped to achieve opposite polarities. For example, when the base semiconductor layer 34 is p-type, the emitter semiconductor layer 32 may be n-type. As such, in one implementation of this emitter-base subcell 30, a p-type base semiconductor layer 34 is disposed adjacent to an n-type emitter semiconductor layer 32 to form a p-n junction.

The semiconductor material of the emitter semiconductor layer 32 may be any appropriate semiconductor material, for example, based on the location of emitter-base subcell 30 in a multijunction solar cell. In one implementation, the semiconductor material may be a Group III-V metal or metal alloy. For example, the semiconductor material may be formed from or may include a Group III-V alloy, comprising AlP, GaP, AlInP, AlGaInP, GaInP, GaN, InN, GaInN, AlGaInN, InP, GaInAsP, AlAs, AlGaAs, GaAs, GaAsP AlGaInAs, GaInAs, AlGaAsSb, GaInAsSb, or combinations thereof. In implementations, the emitter semiconductor layer 32 may be at least one n-type III-V material, including n-type AlP, GaP, AlInP, AlGaInP, GaInP, GaN, InN, GaInN, AlGaInN, InP, GaInAsP, or combinations thereof.

The cross-sectional thickness of the emitter semiconductor layer 32 may depend on various factors, including the composition of the emitter semiconductor layer 32. As a general example, the emitter semiconductor layer 32 may have a cross-sectional thickness ranging from about 0.01 to about 2 microns, for example, from about 0.1 to about 2 microns, including from about 1 to about 2 microns. As a specific example, the emitter semiconductor layer 32 may have a cross-sectional thickness of about 0.1 micron. In one realization, the emitter semiconductor layer 32 may define a plane and the cross-sectional thickness may be measured perpendicular to that plane.

Window Layer 31

The window layer 31 includes a semiconductor material having a bandgap, a polarity, and a cross-sectional thickness. The semiconductor material of the window layer 31 may be any appropriate semiconductor material. Window layer 31 may comprise n-type semiconductor material, such as a Group III-V metal or metal alloy. For example, the window layer 31 may be formed from or may include at least one Group III-V alloy, such as AlP, GaP, GaN, AlN, AlGaN, AlGaP, AlInP, AlGeaInP, GaInP, or combinations thereof.

The polarity of the window layer 31 in the emitter-base subcell 30 may be either positive (i.e., p-type) or negative (i.e., n-type). In one example, the window layer 31 may be lightly or medium-doped as a p-type semiconductor. In another example, the window layer 21 may be lightly or medium-doped as an n-type semiconductor. In an example, the window layer 31 is the same polarity as the emitter semiconductor layer 32. As described above, the base semiconductor layer 34 and emitter semiconductor layer 32 may be configured to form a p-n junction. Accordingly, in one implementation, the window layer 31 comprises an n-type semiconductor and the emitter semiconductor layer 32 also comprises an n-type semiconductor.

The cross-sectional thickness of the window layer 31 may depend on various factors, including the composition of the window layer 31. As a general example, the window layer 31 may have a cross-sectional thickness ranging from about 0.001 to about 0.1 microns. As a specific example, the window layer 31 may have a cross-sectional thickness of about 0.025 micron. In one realization, the window layer 31 may define a plane and the cross-sectional thickness may be measured perpendicular to that plane.

BSF Layer 35

The BSF layer 35 may include a semiconductor material having a bandgap, a polarity, and a cross-sectional thickness.

The semiconductor material of the BSF layer 35 may comprise at least one appropriate semiconductor material, such as a Group III-V metal or metal alloy. For example, the BSF layer 35 may be formed from or may include at least one Group III-V alloy, such as AlGaAs, AlAs, AlGaIn, AlGaInP, GaInP, AlAsSb, AlGaInAs, or combinations thereof. P-type nitrides may also be usable.

The polarity of the BSF layer 35 in the emitter-base subcell 30 may be either positive (i.e., p-type) or negative (i.e., n-type). In one example, the BSF layer 35 may be doped as a p-type semiconductor. In another example, the window layer 21 may be doped as an n-type semiconductor. In an example, the BSF layer 35 is the same polarity as the base layer 34. As described above, the base semiconductor layer 34 and emitter semiconductor layer 32 may be configured to form a p-n junction. Accordingly, in one implementation, the BSF layer 35 comprises a p-type semiconductor and the base semiconductor layer 34 also comprises a p-type semiconductor.

The cross-sectional thickness of the BSF layer 35 may depend on various factors, including the composition of the BSF layer 35. As a general example, the BSF layer 35 may have a cross-sectional thickness ranging from about 0.01 to about 1 micron. As a specific example, the BSF layer 35 may have a cross-sectional thickness of about 0.5 micron. In one realization, the BSF layer 35 may define a plane and the cross-sectional thickness may be measured perpendicular to that plane.

In one implementation, the emitter-base subcell 30 is configured as a top subcell of a multijunction solar cell structure (e.g., FIGS. 7-10 and corresponding descriptions below). In another implementation, the emitter-base subcell 30 is configured as a middle subcell of a multijunction solar cell structure (e.g., FIG. 6 and corresponding descriptions below). In another implementation, the emitter-base subcell 30 is configured as a bottom subcell of a multijunction solar cell structure (e.g., FIGS. 3 and 5 and corresponding descriptions below).

Emitter-Absorber Subcell 50

Figure 2B:
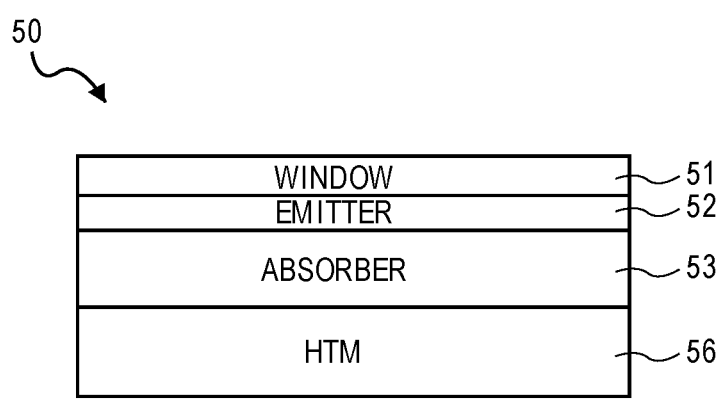
FIG. 2B is a cross-sectional view of a subcell that may be incorporated in one aspect of the disclose solar cell structure.

Referring to FIG. 2B, in another aspect of a subcell, an emitter-absorber subcell 50 may include an n-i-p structure comprised of an emitter semiconductor layer 52, an absorber layer 53, and a hole transport material (HTM) layer 56 positioned over the absorber semiconductor layer 53. Absorber layer 53 and the emitter semiconductor layer 52 may be disposed adjacent to one another. Optionally, the emitter-absorber subcell 50 may also include a transparent conductive oxide layer (not shown), and/or one or more buffer layers (not shown) disposed between the emitter semiconductor layer 52 and the absorber layer 53. Optionally, the emitter-absorber subcell 50 may also include a window layer 51 positioned over the emitter semiconductor layer 52. Other components and layers may also be included in emitter-absorber subcell 50 without departing from the scope of the present disclosure.

Absorber Layer 53

The absorber layer 53 may include a perovskite semiconductor material, such as an organometallic halide ionic solid perovskite, and has a bandgap and a cross-sectional thickness. Generally, the organometallic halide ionic solid perovskite may be represented by the formula, $ABX_3$, where A comprises an organic ion, B comprises a group-IV ion, and X comprises a halide ion. The organic ion may comprise methylammonium (MA), formamidine (FA), at least one alkali metal, or combinations thereof, wherein the alkali metal may comprise cesium (Cs), rubidium (Rb) or both. The group-IV ion may comprise $Pb^+$, $Sn^+$, or a combination thereof and the halide ion may comprise $Cl^-$, $Br^-$, $I^-$, or combinations thereof. For example, the organometallic halide ionic solid perovskite semiconductor material may comprise $MAPbI_{3-x}Cl_x$, $MAPbI_3$, or $MASnI_3$. The organometallic halide ionic solid perovskite semiconductor material may be cesium-doped. In one implementation, the organometallic halide ionic solid perovskite semiconductor material may be an organo-lead halide perovskite. In one specific implementation, the absorber layer 53 may be formed from or may include methylammonium lead iodide ($CH_3NH_3PbI_3$). The organometallic halide ionic solid perovskite semiconductor material may be an organo-lead halide perovskite such as methylammonium lead iodide ($CH_3NH_3PbI_3$), including cesium-doped methylammonium lead iodide. A bandgap of the absorber layer 53 may be from about 1.2 eV to about 2.0 eV, such as from about 1.2 eV to about 1.6 eV, from about 1.6 eV to about 1.7 eV, or from about 1.7 eV to about 2.0 eV.

The cross-sectional thickness of the absorber layer 53 may depend on various factors, including the composition of the absorber layer 53. As a general example, the absorber layer 53 may have a cross-sectional thickness ranging from about 0.1 to about 3 microns, such as from about 0.1 to about 2 microns. As a specific example, the absorber semiconductor layer 53 may have a cross-sectional thickness of about 0.5 micron. In one realization, the absorber semiconductor layer 53 may define a plane and the cross-sectional thickness may be measured perpendicular to that plane.

Emitter Semiconductor Layer 52

The emitter semiconductor layer 52 may share the some or all of the features as described above for emitter semiconductor layer 32 of emitter-base subcell 30 in order to provide similar electronic properties as emitter semiconductor layer 32.

HTM Layer 56

The HTM layer 56 may include a second semiconductor material having a bandgap, a polarity, and a cross-sectional thickness.

In one implementation, the second semiconductor material may be a Group III-V metal or metal alloy. For example, the semiconductor material may include a Group III-V alloy, comprising AlAs, AlGaAs, GaAs, GaAsP AlGaInAs, GaInAs, AlGaAsSb, GaInAsSb, or combinations thereof. The emitter semiconductor layer 52 and HTM layer 56 may be doped to achieve opposite polarities from one another. As such, in one implementation of this emitter-absorber subcell 50, a p-type HTM layer 56 is disposed on one side of the absorber layer 53 and an n-type emitter semiconductor layer 52 is disposed on an opposing side of the absorber layer 53 such that layers 52, 53, 56 together form a p-i-n structure.

As described above, the HTM layer 56, the absorber layer 53 and emitter semiconductor layer 52 may be configured to form a p-i-n junction. Thus, in implementations, the HTM layer 56 may be at least one p-type III-V material, including AlAs, AlGaAs, GaAs, GaAsP AlGaInAs, GaInAs, AlGaAsSb, GaInAsSb, or combinations thereof. For III-V/perovskite interfaces, such as that between the HTM layer 56 and absorber layer 53, such materials comprise conduction bands (Ec) that are near or above the perovskites of the absorber layer, while their valence bands (Ev) are substantially similar to those of the perovskites of the absorber layer.

A bandgap of the HTM layer 56 may be the same or different than the bandgap of the absorber layer 53. That is, the bandgap of the HTM layer 56 may be about the same or greater than (i.e., as low as) that of the perovskite-based absorber layer 53. As one example, the bandgap of the HTM layer 56 may be greater than the bandgap of the absorber layer 53.

Window Layer 51

The window layer 51 of emitter-absorber subcell 50 may include some or all of the features as described above for window layer 31 of emitter-base subcell 30.

Additionally, because perovskite materials may be susceptible to moisture, the layer comprising at least one perovskite material, such as, absorber layer 53, may be hermetically sealed from humidity penetration. For example, the emitter and HTM layers may form smooth interfaces with the absorber layer 53 comprising the perovskite. Such a configuration may prevent or minimize water ingress, for example, to all but edges of the solar cell device. Deficiencies caused by moisture penetration may be addressed by optionally replacing other water susceptible materials. Accordingly, in an example, the device may not comprise 2,2',7,7'-Tetrakis[N,N-di(4-methoxyphenyl)amino]-9,9'-spirobifluorene (also referred to as "Spiro-OMeTAD").

In one implementation, the emitter-absorber subcell 50 is configured as a top subcell of a multijunction solar cell structure. In another implementation, the emitter-absorber subcell 50 is configured as a middle subcell of a multijunction solar cell structure. In another implementation, the emitter-absorber subcell 50 is configured as a bottom subcell of a multijunction solar cell structure (see FIG. 7 and corresponding descriptions below). The positioning of a subcell, for example, emitter-absorber subcell 50, at the top, bottom or middle of a multijunction solar cell structure is selected based on the wavelength of electromagnetic radiation to be absorbed by the subcell active layer and depends, therefore, on the semiconductor materials (and respective bandgaps) selected for the different layers of the subcell. For example, in some instances, it is desirable to select a particular semiconductor material, perhaps based on favorable characteristics or ease of processing, but that semiconductor material may be susceptible to damage when exposed to certain wavelengths. Thus, in such instances, it is possible to protect the selected semiconductor material by positioning subcells that absorb the damaging wavelengths toward a light-receiving end of the solar cell such that the damaging wavelength is limited or prevented from reaching the particular semiconductor material of interest.

Absorber-Base Subcell 70

Figure 2C:
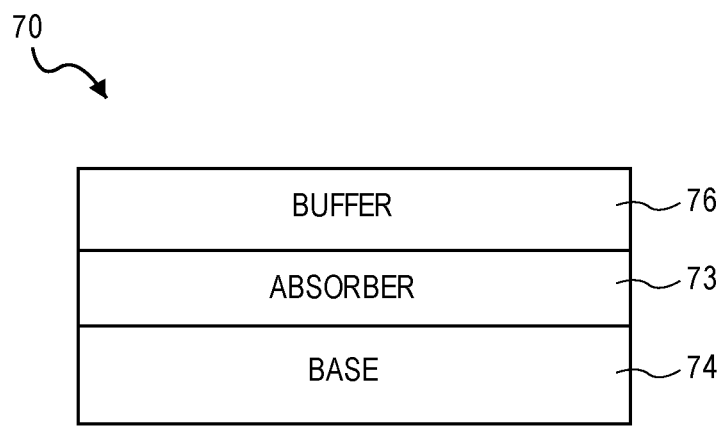
FIG. 2C is a cross-sectional view of a subcell that may be incorporated in one aspect of the disclose solar cell structure.

Referring to FIG. 2C, in another aspect of a subcell, an absorber-base subcell 70 may include an absorber layer 73, and a base semiconductor layer 74 positioned over the absorber layer 73. Absorber layer 73 and the base semiconductor layer 74 may be disposed adjacent to one another, for example in direct contact with one another. Alternatively, absorber layer 73 and the base semiconductor layer 74 may be separated by one or more additional layers. Optionally, the absorber base subcell 70 may also include one or more buffer layer 76 disposed over the absorber layer 73. Other components and layers may also be included in emitter-absorber subcell 50 without departing from the scope of the present disclosure.

Absorber Layer 73

The absorber layer 73 of absorber-base subcell 70 may include some or all of the features as described above for absorber layer 53 of emitter-absorber subcell 50.

Base Semiconductor Layer 74

The base semiconductor layer 74 of absorber-base subcell 70 may include all of the features as described above for base semiconductor layer 34 of emitter-base subcell 30. In an example, the bandgap of the base semiconductor layer 74 may be selected to be greater than a bandgap of the absorber layer 73.

The polarity of the base semiconductor layer 74 in the absorber-base subcell 70 may be either positive (i.e., p-type) or negative (i.e., n-type). In one example, the base semiconductor layer 74 may be doped as a p-type conductive material. In another example, the base layer 74 may be doped as an n-type semiconductor. In an implementation, the absorber-base subcell 70 is configured as a p-i-n structure and the base layer 74 is doped as a p-type semiconductor to serve as a hole conducting layer.

Buffer Layer 76

The buffer layer 76 includes a conductive material, a polarity, and a cross-sectional thickness.

In an implementation, the conductive material of the buffer layer 76 may be any appropriate conductive material. In one implementation, the conductive material of the buffer layer 76 may be transparent conductive oxide. For example, the buffer layer 76 may be formed from or may include a transparent conductive oxide, such as indium tin oxide (ITO), fluorinated indium tin oxide (FTO), gallium oxide ($Ga_2O_3$), zinc oxide (ZnO), titanium oxide $TiO_2$, and combinations thereof.

The polarity of the buffer layer 76 in the absorber-base subcell 70 may be either positive (i.e., p-type) or negative (i.e., n-type). In one example, the buffer layer 76 may be doped as a p-type conductive material. In another example, the buffer layer 76 may be doped as an n-type semiconductor. In an implementation, the absorber-base subcell 70 is configured as a p-i-n structure and the buffer layer 76 is doped as an n-type semiconductor to serve as an electron conducting layer.

The cross-sectional thickness of the buffer layer 76 may depend on various factors, including the composition of the buffer layer 76. As a general example, the buffer layer 76 may have a cross-sectional thickness ranging from about 0.01 to about 2 microns, for example, from about 0.1 to about 2 microns, including from about 1 to about 2 microns. As a specific example, the buffer layer 76 may have a cross-sectional thickness of about 0.1 micron. In one realization, the buffer layer 76 may define a plane and the cross-sectional thickness may be measured perpendicular to that plane.

In an example, the buffer layer 76 comprises a single crystalline layer. In an example, the buffer layer 76 comprises a III-V semiconductor.

Perovskite materials, such as those of absorber layer 73, may be subject to thermal degradation when exposed to elevated temperatures, such as those above 100° C. Accordingly, in an example, no oxygen atoms are present at an interface between the absorber layer 73 and the buffer layer 76. While not limited to any particular theory, it is believed that replacing conventional oxygenated electron transport materials, such as those comprising unstable polycrystalline TiO2 or Al2O3 with the single crystalline III-V semiconductor material, removes oxygen atoms and leads to the elimination of reactive oxygen atoms from the perovskite absorber/electron conducting buffer layer interface which reduces deprotonating reactions.

In one implementation, the absorber-base subcell 70 is configured as a top subcell of a multijunction solar cell structure (e.g., FIGS. 3-6 and corresponding descriptions below). In another implementation, the absorber-base subcell 70 is configured as a middle subcell of a multijunction solar cell structure. In another implementation, the absorber-base subcell 70 is configured as a bottom subcell of a multijunction solar cell structure. As described above, a subcell may be placed at the top, middle or bottom of a semiconductor device based on its ability to absorb certain wavelengths of electromagnetic energy and/or to protect the semiconductor layers thereof that may be susceptible to certain wavelengths.

Emitter-Absorber-Base Subcell 80

Figure 2D:
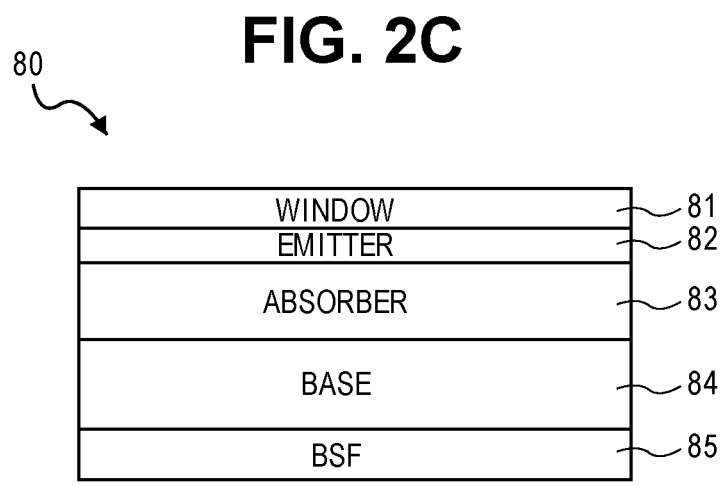
FIG. 2D is a cross-sectional view of a subcell that may be incorporated in one aspect of the disclose solar cell structure.

In an example depicted as FIG. 2D, an emitter-absorber-base subcell 80 may include a base semiconductor layer 84, an emitter semiconductor layer 82, and an absorber layer 83 disposed between the base semiconductor layer 84 and the emitter semiconductor layer 82. As described above, a subcell may be placed at the top, middle or bottom of a semiconductor device based on its ability to absorb certain wavelengths of electromagnetic energy and/or to protect the semiconductor layers thereof that may be susceptible to certain wavelengths. Accordingly, in one implementation, the emitter-absorber-base subcell 80 is positioned as a top subcell of a multijunction solar cell structure. In another implementation, the emitter-absorber-base subcell 80 is positioned as a middle subcell of a multijunction solar cell structure (e.g., FIG. 9 and corresponding descriptions below). In another implementation, the emitter-absorber-base subcell 80 is positioned as a bottom subcell of a multijunction solar cell structure (e.g., FIGS. 8 & 10 and corresponding descriptions below).

Optionally, the emitter-absorber-base subcell 80 may also include a transparent conductive oxide layer (not shown), and/or one or more buffer layers (not shown) disposed between the emitter semiconductor layer 82 and the absorber layer 83. Optionally, the emitter-base subcell 30 may also include a window layer 81 positioned over the emitter semiconductor layer 82 and a back surface field (BSF) layer 85 positioned over the base semiconductor layer 84. Other components and layers may also be included in emitter-absorber-base subcell 80 without departing from the scope of the present disclosure. The base semiconductor layer 84 and the absorber layer 83 may be disposed adjacent to one another, for example in direct contact with one another. Alternatively, base semiconductor layer 84 and the absorber layer 83 may be separated by one or more additional materials. The absorber layer 83 and the emitter semiconductor layer 82 may be disposed adjacent to one another, for example in direct contact with one another. Alternatively, absorber layer 83 and the emitter semiconductor layer 82 may be separated by one or more additional materials.

Base Semiconductor Layer 84

The base semiconductor layer 84 emitter-absorber-base subcell 80 may include some or all of the features as described above for base semiconductor layer 34 of emitter-base subcell 30.

Absorber Layer 83

The absorber layer 83 of emitter-absorber-base subcell 80 may include some or all of the features as described above for absorber layer 53 of emitter-absorber subcell 50.

Emitter Semiconductor Layer 82

The emitter semiconductor layer 82 of emitter-absorber-base subcell 80 may share some or all of the features as described above for emitter semiconductor layer 32 of emitter-base subcell 30.

Window Layer 81

The window layer 81 of emitter-absorber-base subcell 80 may include some or all of the features of window layer 31 of emitter-base subcell 30.

BSF Layer 85

The BSF layer 85 of emitter-absorber-base subcell 80 may include some or all of the features of BSF layer 35 of emitter-base subcell 30.

Emitter-Active Substrate Subcell 90

Figure 2E:
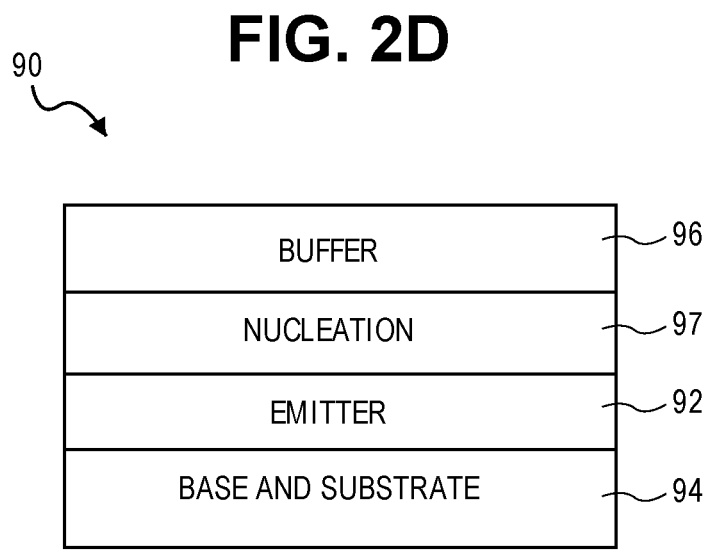
FIG. 2E is a cross-sectional view of a subcell that may be incorporated in one aspect of the disclose solar cell structure.

In an example depicted as FIG. 2E, an emitter-active substrate subcell 90 may include a base semiconductor substrate 94 and an emitter semiconductor layer 92. Optionally, to assist with fabrication, such as growth of overlying semiconductor layers, such as those of another subcell formed over the emitter-active substrate subcell 90, additional layers such as a nucleation layer 97 positioned over the emitter semiconductor layer 92 and a buffer layer 96 positioned over the nucleation layer 97 may be included. Other components and layers may also be included in emitter-active substrate subcell 90 without departing from the scope of the present disclosure.

Base Semiconductor Substrate 94

The base semiconductor substrate 94 may comprise a semiconductor wafer and has a bandgap, a polarity, and a cross-sectional thickness. The semiconductor material of the base semiconductor substrate 94 may be any appropriate semiconductor material, for example, germanium or silicon. The polarity of the base semiconductor substrate 94 may be positive (i.e., p-type). In one example, the base semiconductor substrate 94 may be doped p-type semiconductor. In one implementation, the semiconductor material of the base semiconductor substrate 94 may be a p-doped Si or a p-doped Ge.

The cross-sectional thickness of the base semiconductor substrate 94 may depend on various factors, including the composition of the base semiconductor substrate 94. As a general example, the base semiconductor substrate 94 may have a cross-sectional thickness ranging from about 0.1 to about 10 microns. As a specific example, the base semiconductor substrate 94 may have a cross-sectional thickness of about 1 micron. In one realization, the base semiconductor substrate 94 may define a plane and the cross-sectional thickness may be measured perpendicular to that plane.

Emitter Semiconductor Layer 92

The emitter semiconductor layer 92 may include a semiconductor material and has a bandgap, a polarity, and a cross-sectional thickness. The emitter semiconductor layer 92 may be a portion of the base semiconductor substrate 94. For example, emitter semiconductor layer 92 can be formed by diffusion into the base semiconductor substrate 94 of, for example, column-V elements from subsequent epitaxial growth of III-V semiconductors over the base semiconductor substrate 94.

In one implementation, the emitter-active substrate subcell 90 is configured as a bottom subcell of a multijunction solar cell structure. The base semiconductor substrate 94, therefore, may serve as a substrate for epitaxial growth of semiconductor layers for upper sub cells.

Buffer Layer 96 and Nucleation Layer 97

The epitaxial growth of semiconductor layers on and/or over the substrate may be initiated with a nucleation layer 97, and a buffer layer 96, which may contain one or more semiconductor layers. Such growth typically occurs between the nucleation layer 97 and the subsequent epitaxial subcell that may be formed over emitter-active substrate subcell 90 in a multijunction solar cell. The nucleation layer 97 can also serve as a window layer for the emitter-active substrate subcell 90.

Returning to FIGS. 1A-1B a multijunction photovoltaic device, such as solar cell structure 10 may be a 2-junction (2J) device, or, such as solar cell structure 10', may be a 3-junction (3J) device. As described in more detail below, the multijunction photovoltaic device generally includes a first subcell comprising a base semiconductor layer and a second semiconductor layer. The base semiconductor layer comprises a Group III-V semiconductor material, such as described above. The solar cell structures 10 and 10' may also include a second subcell comprising an absorber layer, wherein the absorber layer comprises an organometallic halide ionic solid perovskite semiconductor material as described above.

The organometallic halide ionic solid perovskite semiconductor material may comprise an organo-lead halide perovskite such as an organometallic halide ionic solid perovskite semiconductor material. Generally, the organometallic halide ionic solid perovskite may be represented by the formula, $ABX_3$, where A comprises an organic ion, B comprises a group-IV ion, and X comprises a halide ion. The organic ion may comprise methylammonium (MA), formamidine (FA), at least one alkali metal, or combinations thereof, wherein the alkali metal may comprise cesium (Cs), rubidium (Rb) or both. The group-IV ion may comprise $Pb^+$, $Sn^+$, or a combination thereof and the halide ion may comprise $Cl^-$, $Br^-$, $I^-$, or combinations thereof. In an example, the organometallic halide ionic solid perovskite comprises methylammonium lead iodide ($CH_3NH_3PbI_3$), methylammonium lead bromide ($CH_3NH_3PbBr_3$), methylammonium lead chloride ($CH_3NH_3PbCl_3$), methylammonium tin bromide ($CH_3NH_3SnI_3$), methylammonium tin bromide ($CH_3NH_3SnBr_3$), formamidinium lead iodide ($NH_2CH=NH_2PbI_3$), or mixtures thereof The organometallic halide ionic solid perovskite may have a bandgap in the range of from about 1.2 eV to about 2.0 eV, for example from about gap of from about 1.2 eV to about 1.6 eV, including from about 1.7 eV to about 2.0 eV. Accordingly, appropriate hole transport material and buffer layer materials may be selected based on the perovskite bandgaps to allow electrons or holes to pass from the perovskite layer while blocking the opposite carrier.

The second semiconductor layer of the second subcell may generally comprise an emitter semiconductor layer. The base semiconductor layer may comprise substantially the same chemical composition as the emitter semiconductor layer.

In one example, the first subcell may generally comprise a top subcell, the second subcell may comprise a bottom subcell, and the second subcell may further comprises a hole transport material layer. In such an example, the organometallic halide ionic solid perovskite may comprise a first bandgap having a value of from about 1.2 eV to about 1.6 eV, and a bandgap of the base semiconductor may comprise a bandgap having a value that is larger than that of the first bandgap. In such an example in which the first subcell may comprises a top subcell and the second subcell may a bottom subcell, the III-V semiconductor material may be tuned to absorb at ultraviolet (UV) wavelengths.

In another example, the second subcell may further generally comprise a buffer layer and a base layer, wherein the organometallic halide ionic solid perovskite is disposed between the buffer layer and the base layer. In such an example, the organometallic halide ionic solid perovskite may comprise a first bandgap having a value of from about 1.7 eV to about 2.0 eV, and a bandgap of the base semiconductor may comprise a second bandgap having a value that is smaller than the first bandgap.

In yet another example as described further below, the multijunction photovoltaic device, such as a 3J device, may further generally comprises a third subcell. In such an example of a 3J device, the second subcell may comprise a top subcell, the third subcell may comprise a bottom subcell and the first subcell may comprise a middle subcell disposed between the top subcell and bottom subcell. Further, in such an example, the third subcell may comprise a germanium substrate. Additionally, in such an example of a 3J device, the organometallic halide ionic solid perovskite may comprise a first bandgap, and a bandgap of the base semiconductor may have a value that is larger than the first bandgap. Further still, in such an example of a 3J device, the base semiconductor may comprise a bandgap having a value of from about 1.8 eV to about 1.9 eV, and the first bandgap of the organometallic halide ionic solid perovskite may have a value of from about 1.2 eV to about 1.6 eV.

2J Photovoltaic Device

Implementation of a 2J device

Figure 3:
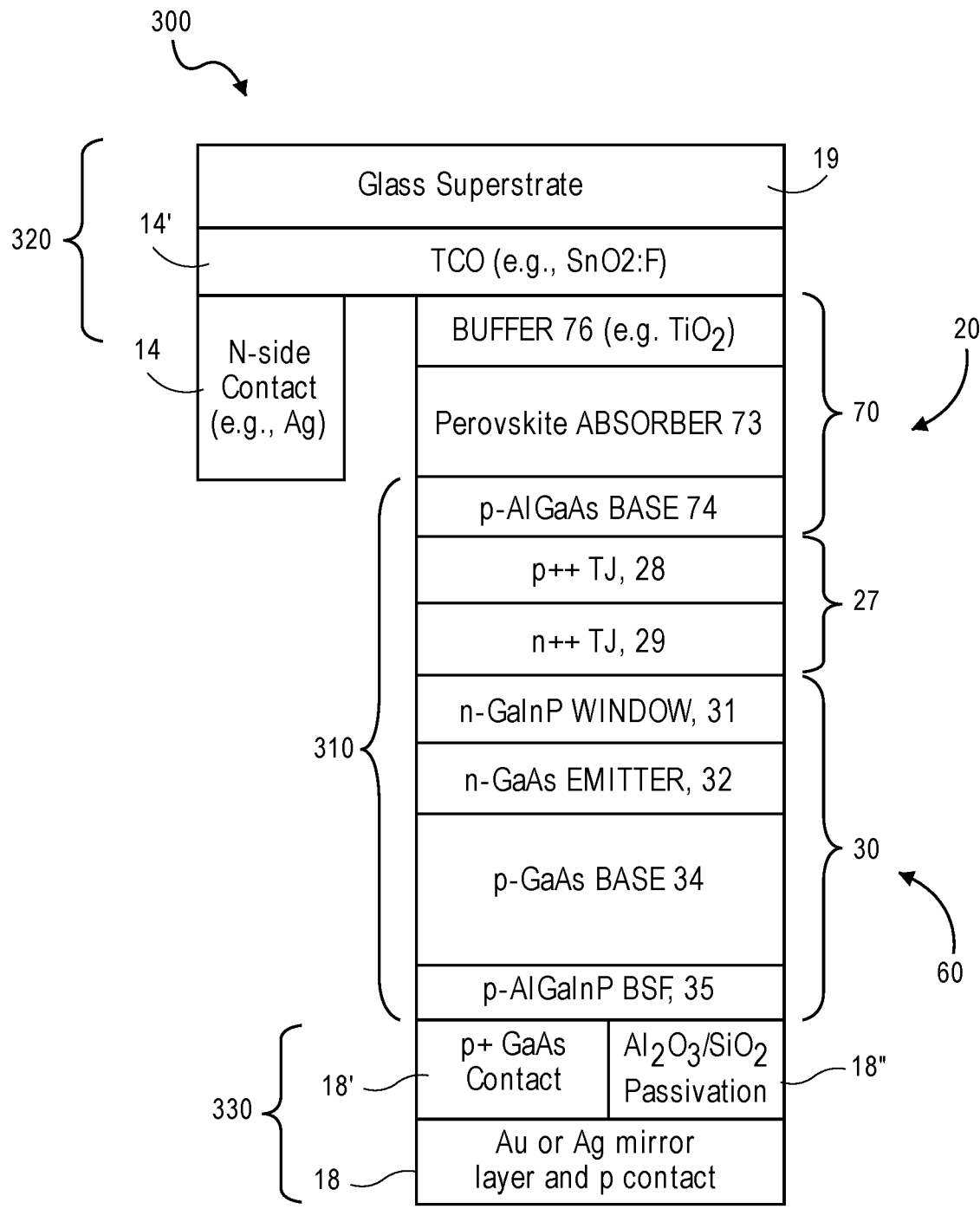
FIG. 3 is a cross-sectional view of an exemplary perovskite/III-V 2-junction solar cell structure with GaAs as the III-V material.

In an implementation of a 2J photovoltaic device, the first subcell may comprise an emitter-base subcell, for example, emitter-base subcell 30 of FIG. 2A, configured as a bottom subcell 60. The second subcell may comprise an absorber-base subcell, such as absorber-base subcell 70 of FIG. 2C, configured as a top subcell 20. An exemplary photovoltaic cell of this implementation is shown in FIG. 3 and described in more detail below.

Figure 4:
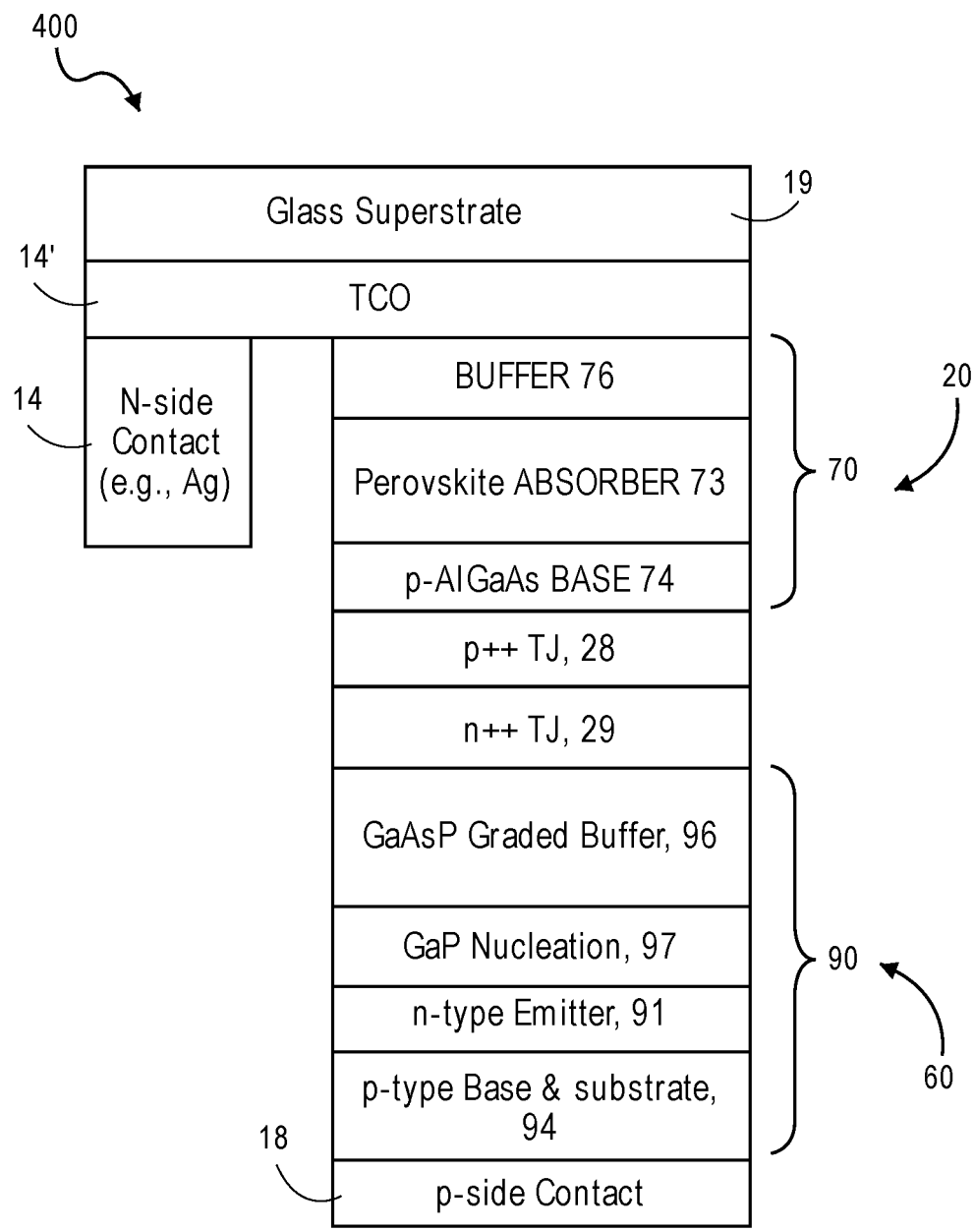
FIG. 4 is a cross-sectional view of an exemplary perovskite/Si 2-junction solar cell structure.

In an implementation of such a solar cell structure 10, the first subcell may be selected from emitter-active substrate subcell 90 configured as a bottom subcell 60, and the second subcell may be selected from absorber-base subcell 70 configured as a top subcell 20. An exemplary photovoltaic cell of such a configuration is shown in FIG. 4 and described in more detail below.

Figure 5:
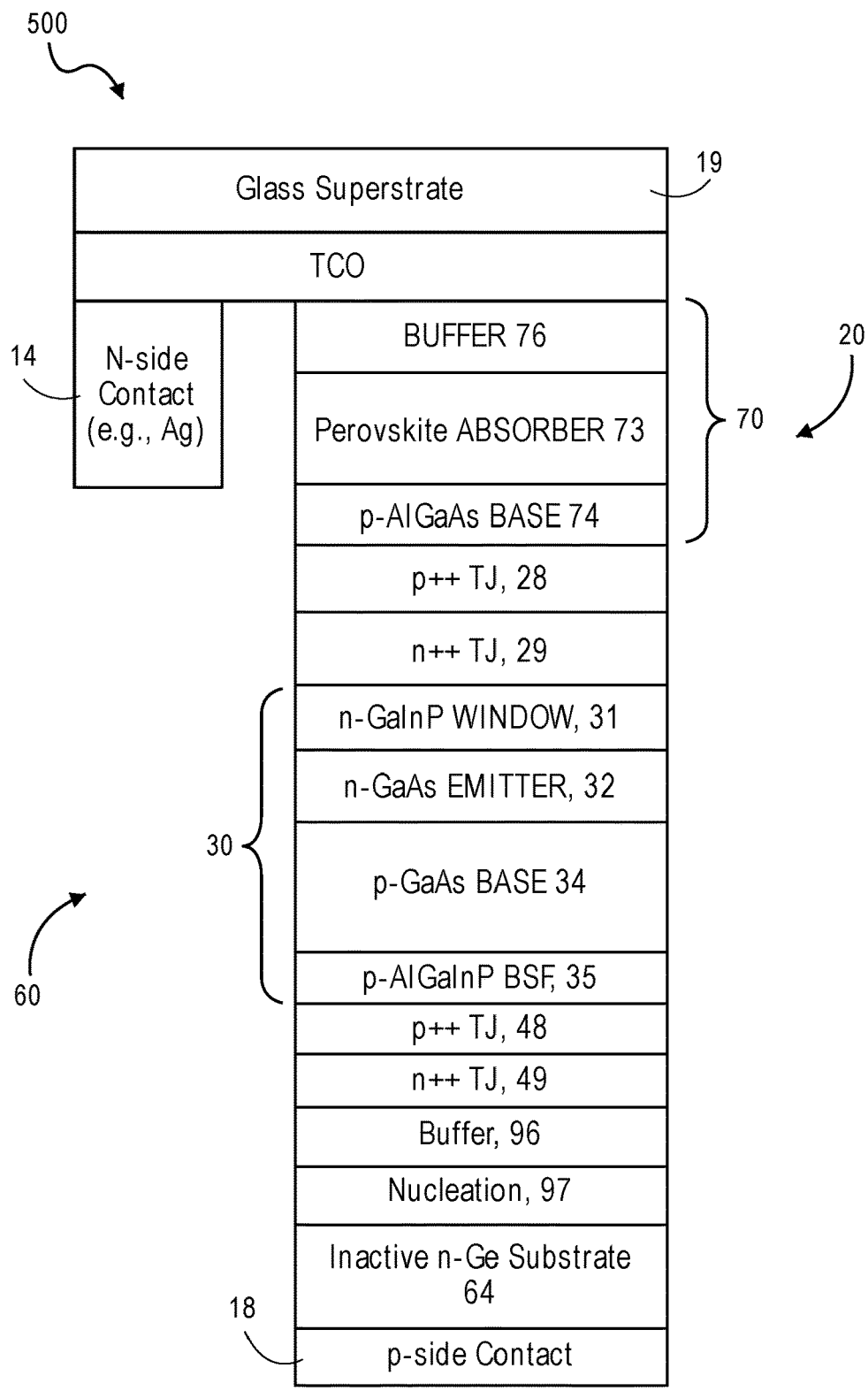
FIG. 5 is a cross-sectional view of an exemplary perovskite/III-V 2-junction solar cell structure with GaAs as the III-V material and with an inactive Ge backside structure.

In an implementation of a 2J photovoltaic device, the first subcell may be selected from emitter-base subcell 30 configured as a bottom subcell 60, and the second subcell may be selected from absorber-base subcell 70 configured as a top subcell 20. In such an implementation, emitter-base subcell 30 and absorber-base subcell 70 are positioned above an inactive substrate, such as an inactive germanium substrate. An exemplary photovoltaic cell of this implementation is shown in FIG. 5 and described in more detail below.

Figure 7:
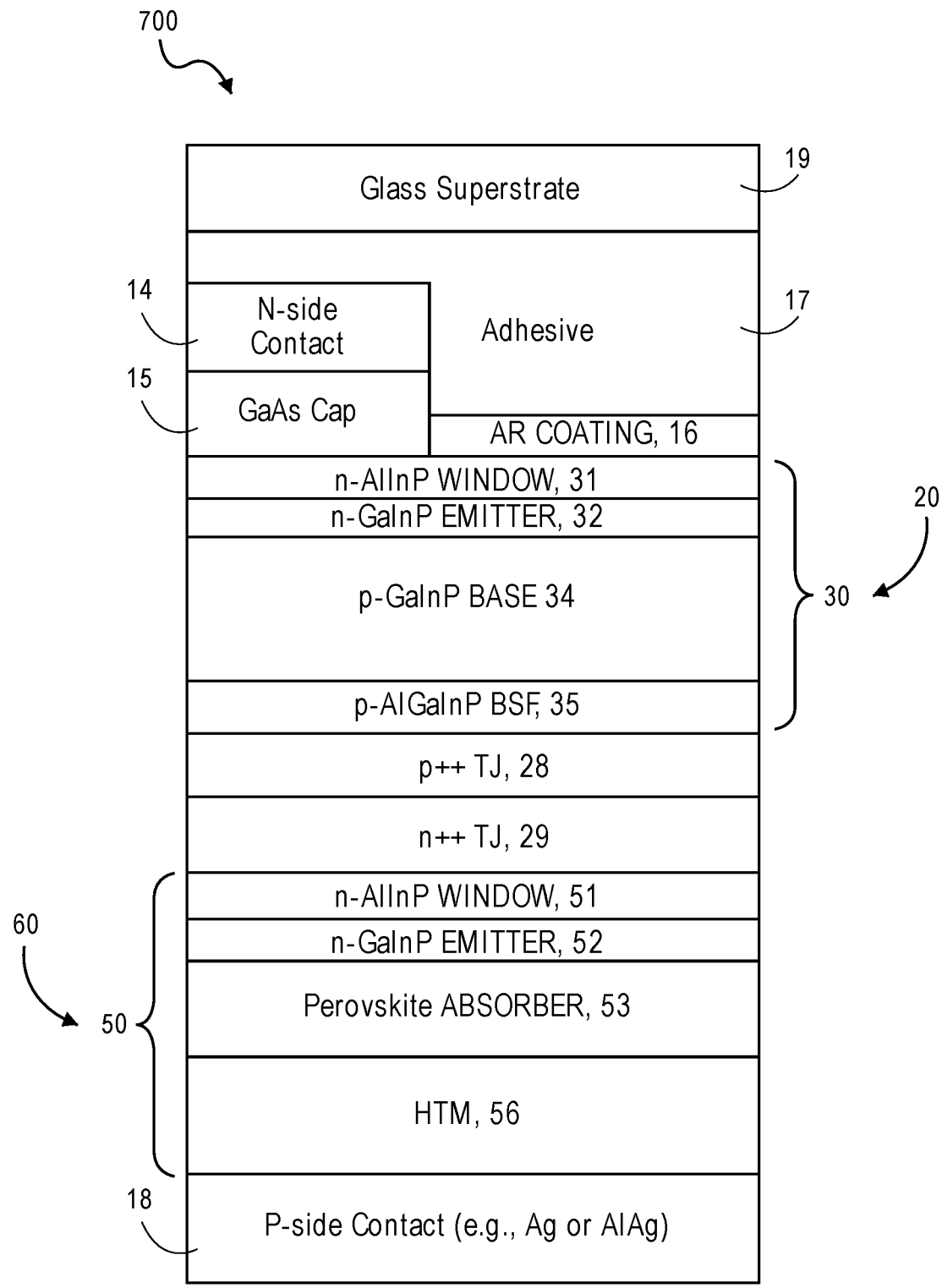
FIG. 7 is a cross-sectional view of an exemplary III-V/perovskite 2-junction solar cell structure with GaInP as the III-V material.

In an implementation of a 2J photovoltaic device, the first subcell may be selected from emitter-base subcell 30 configured as a top subcell 20, and the second subcell may be selected from emitter-absorber subcell 50 configured as a bottom subcell 60. An exemplary photovoltaic cell of this implementation is shown in FIG. 7 and described in more detail below.

Figure 8:
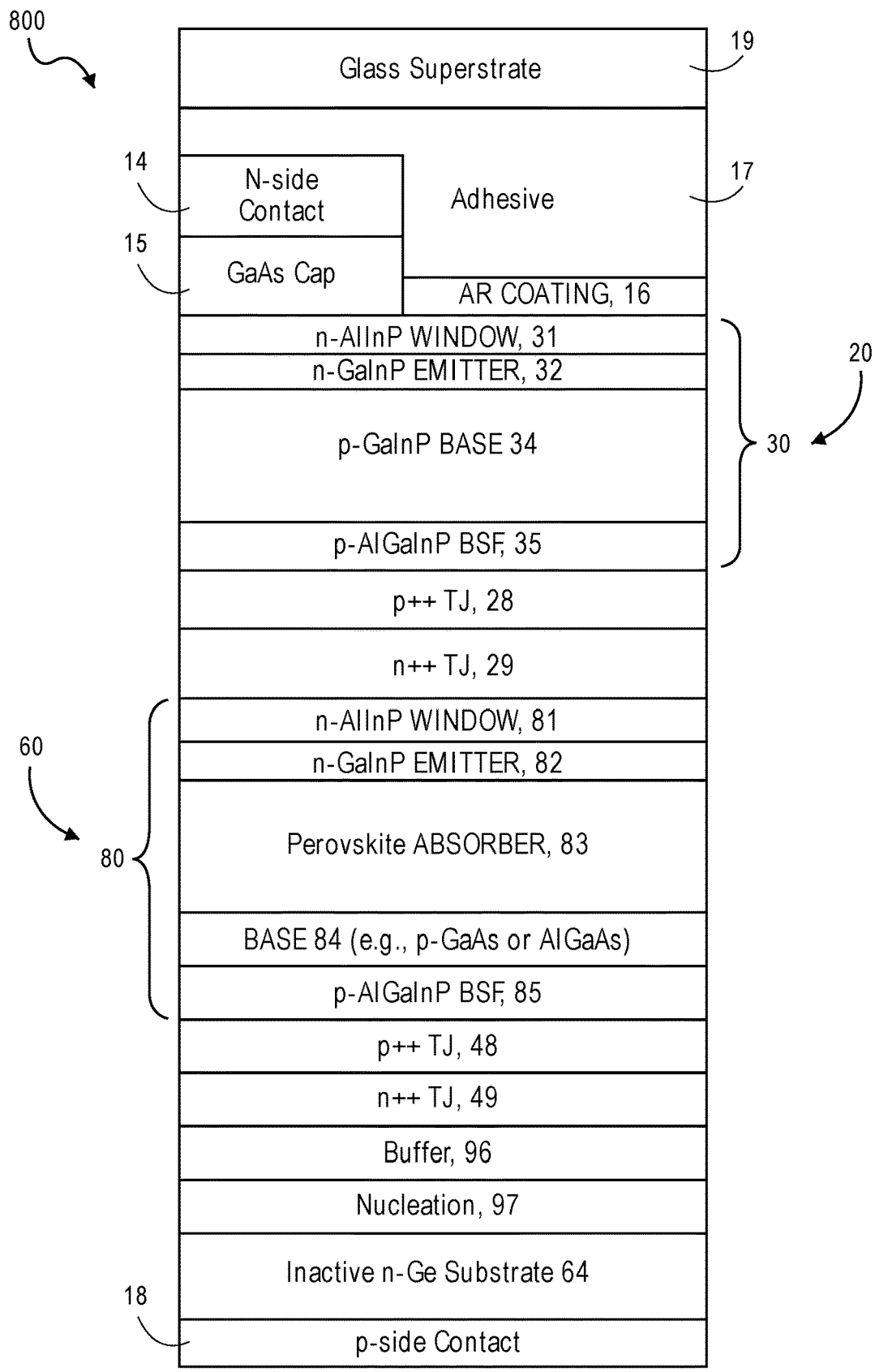
FIG. 8 is a cross-sectional view of an exemplary III-V/perovskite 2-junction solar cell structure with GaInP as the III-V material and with an inactive Ge backside structure.

In an implementation of a 2J photovoltaic device, the first subcell may be selected from emitter-base subcell 30 configured as a top subcell 20, and the second subcell may be selected from emitter-absorber-base subcell 80 configured as a bottom subcell 60. In such an implementation, emitter-base subcell 30 and emitter-absorber-base subcell 80 are positioned above an inactive substrate, such as an inactive germanium substrate. An exemplary photovoltaic cell of this implementation is shown in FIG. 8 and described in more detail below.

3J Photovoltaic Device

Returning to FIG. 1B, a multijunction photovoltaic device, such as solar cell structure 10', may be a 3-junction (3J) device and includes a first subcell comprising a base semiconductor layer and a second semiconductor layer. The base semiconductor layer comprises a Group III-V semiconductor material. The solar cell structure 10 may also include a second subcell comprising an absorber layer, wherein the absorber layer comprises an organometallic halide ionic solid perovskite semiconductor material. The solar cell structure 10 may also include a third subcell. The third subcell may comprise a germanium substrate or a silicon substrate.

Figure 6:
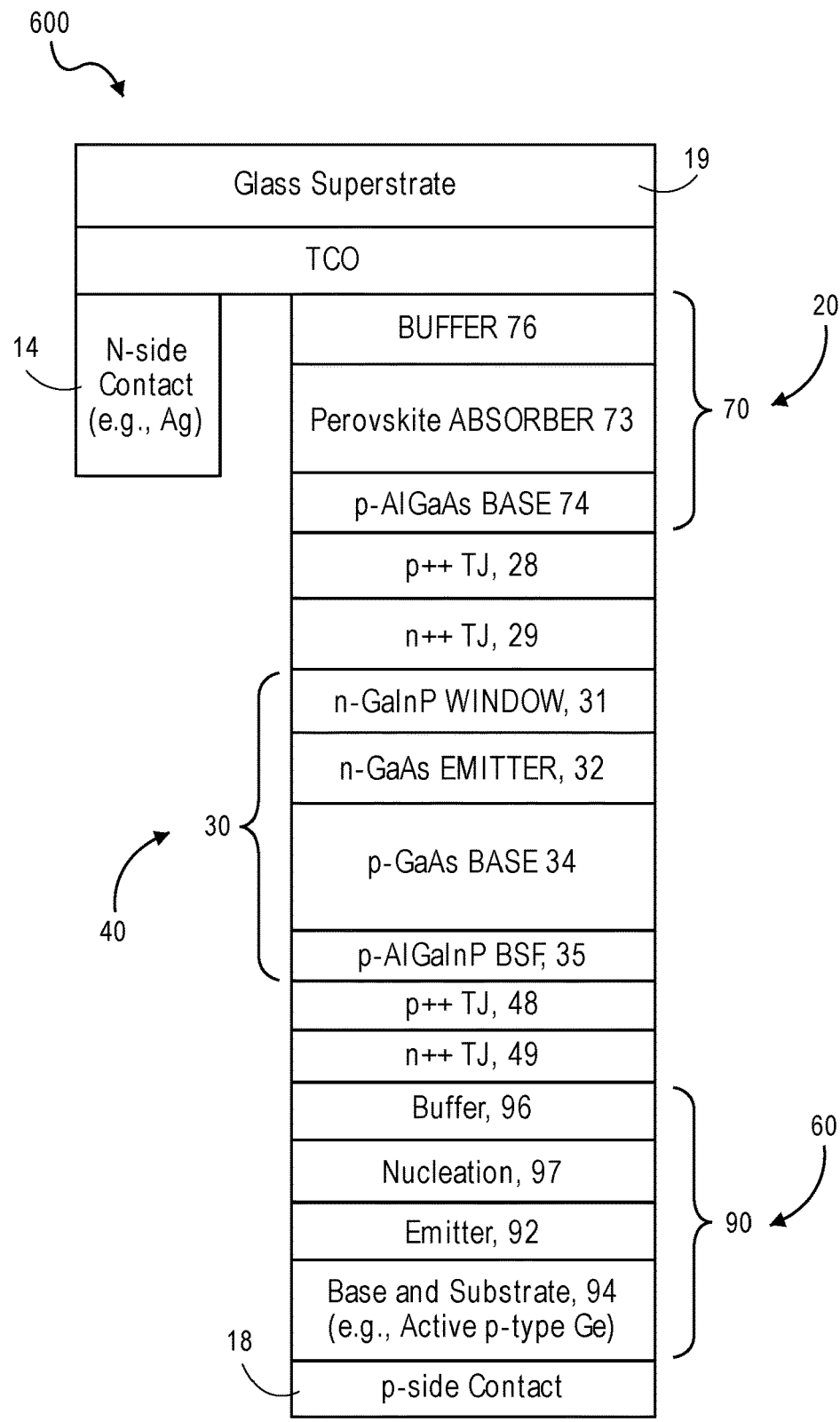
FIG. 6 is a cross-sectional view of an exemplary perovskite/III-V/Ge 3-junction solar cell structure with GaAs as the III-V material.

In an implementation of a 3J photovoltaic device, the first subcell may be selected from emitter-base subcell 30 configured as a middle subcell 40, the second subcell may be selected from absorber-base subcell 70 configured as a top subcell 20, and the third subcell may be selected from emitter-active substrate subcell 90 configured as a bottom subcell 60. An exemplary photovoltaic cell of this implementation is shown in FIG. 6 and is described in more detail below.

Figure 9:
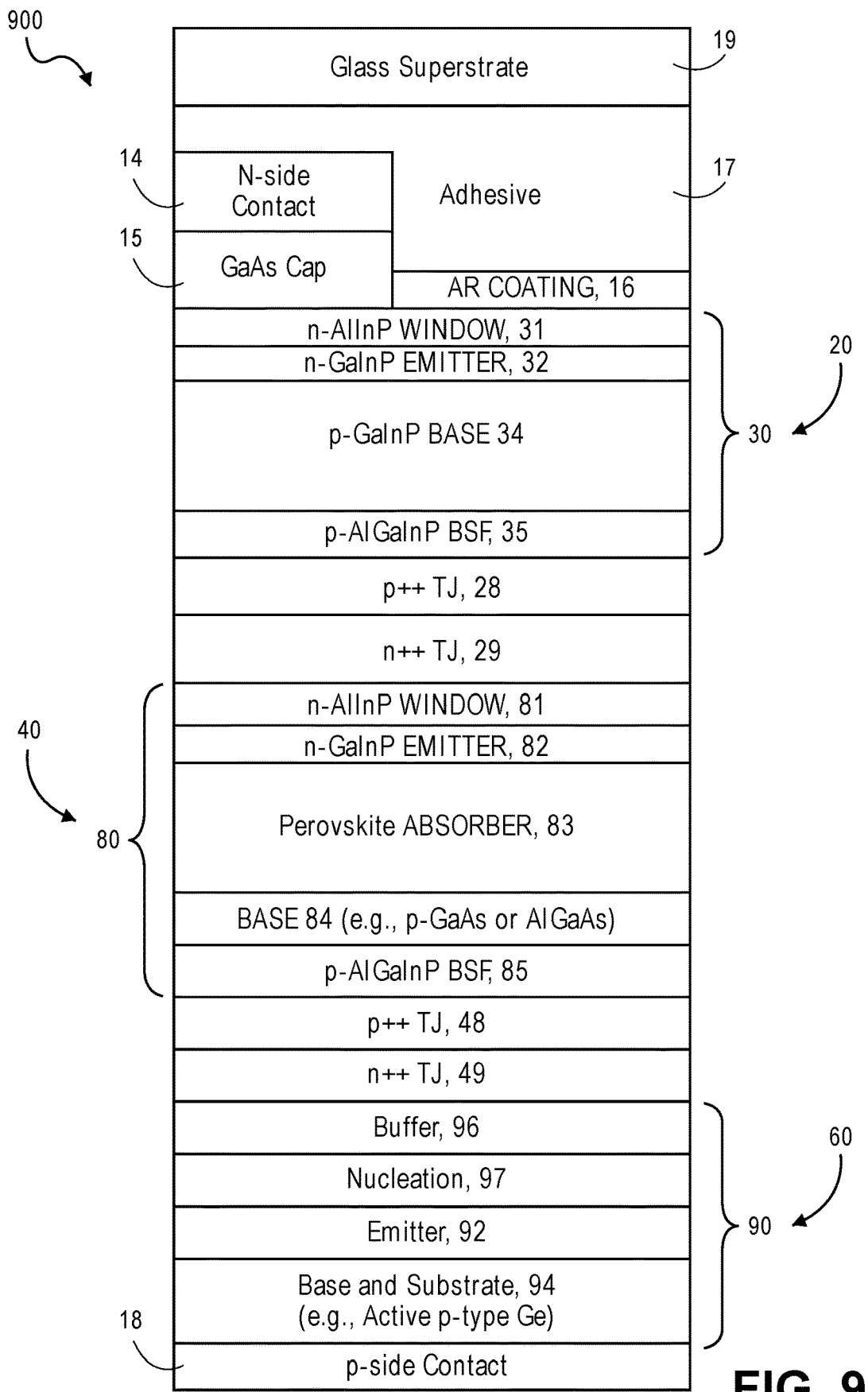
FIG. 9 is a cross-sectional view of an exemplary III-V/perovskite/Ge 3-junction solar cell structure with GaInP as the III-V material.

In an implementation of a 3J photovoltaic device, the first subcell may be selected from emitter-base subcell 30 configured as a top subcell 20, the second subcell may be selected from emitter-absorber subcell 80 configured as a middle subcell 40, and the third subcell may be selected from emitter-active substrate subcell 90 configured as a bottom subcell 60. An exemplary photovoltaic cell of this implementation is shown in FIG. 9 and is described in more detail below.

Figure 10:
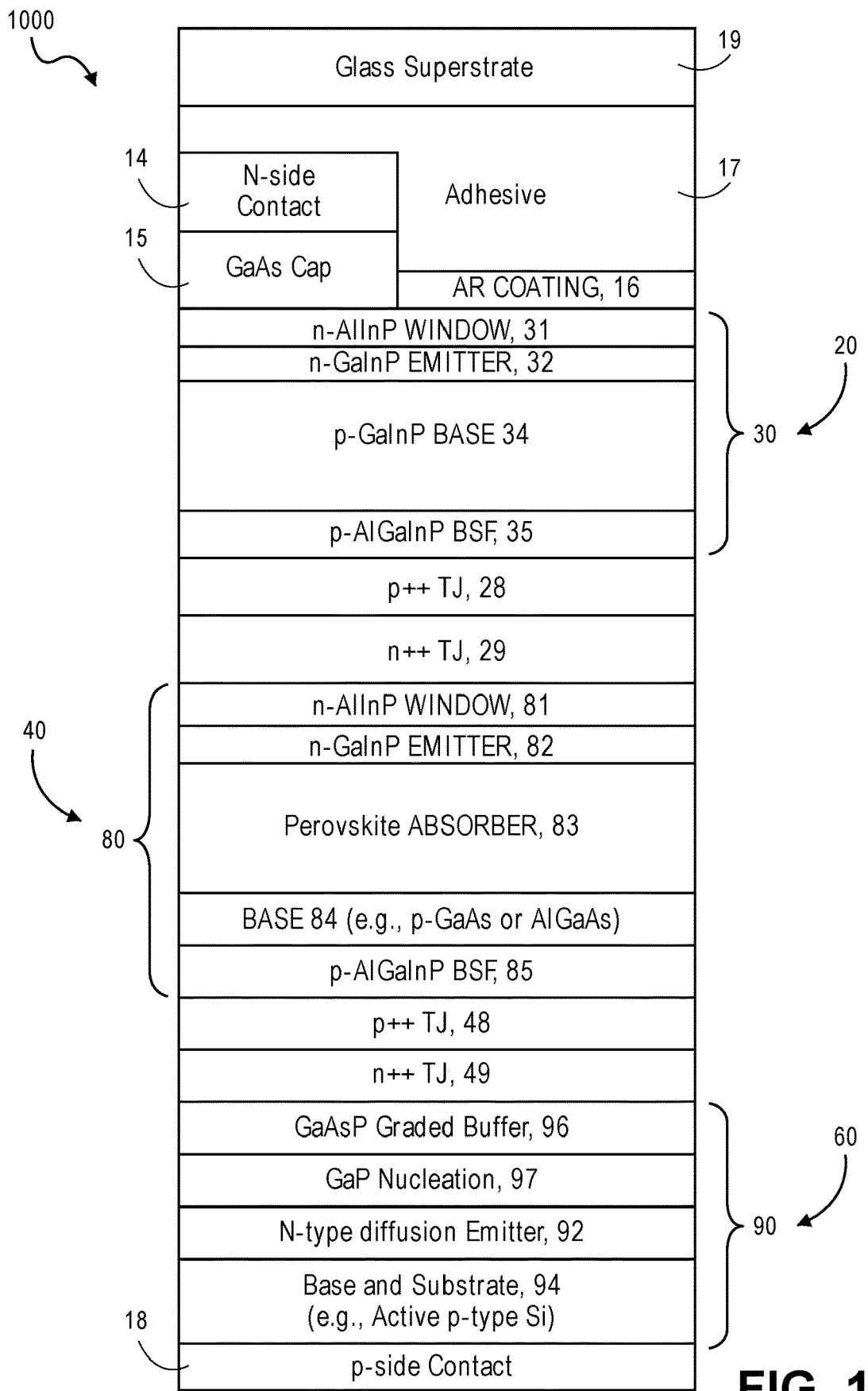
FIG. 10 is a cross-sectional view of an exemplary perovskite/Si 2-junction solar cell structure.

In an implementation of a 3J photovoltaic device, the first subcell may be selected from emitter-base subcell 30 configured as a top subcell 20, the second subcell may be selected from emitter-absorber subcell 80 configured as a middle subcell 40, and the third subcell may be selected from emitter-active substrate subcell 90 configured as a bottom subcell 60. An exemplary photovoltaic cell of this implementation is shown in FIG. 10 and is described in more detail below.

For the multijunction PV device, efficiency may be limited by the requirement of low resistance interfaces between the individual cells to enable the generated current to flow from one cell to the next. Accordingly, in a monolithic structure, tunnel junctions can be used to minimize the blockage of current flow. In addition to providing the lowest resistance path possible between adjacent subcells, the tunnel junction should also be transparent to wavelengths of light that can be used by lower subcells in the MJ stack, because of the poor collection efficiency of carriers that are photogenerated in the tunnel junction region. These properties are all dependent on the bandgap, doping levels, optical properties, and minority-carrier recombination and diffusion properties of the base, emitter, window, BSF, and tunnel junction layers employed in the device.

EXAMPLES

Example 1—III-V/Perovskite 2-Junction Device

Referring now to FIG. 3, a cross-section of an exemplary multijunction photovoltaic device 300 is presented. The multijunction photovoltaic device 300 includes two subcells, emitter-base subcell 30 and absorber-base subcell 70, connected in electrical series. These subcells, emitter-base subcell 30 and absorber-base subcell 70 may be referred to according to the material of their respective base semiconductor layer 34 or absorber layer 73. For instance, the multijunction photovoltaic device 300 may comprise a GaAs emitter-base subcell 30 with a p-GaAs base semiconductor layer 34, and absorber-base subcell 70 comprising a perovskite absorber layer 73. The perovskite may be any of the perovskite materials disclosed herein as represented by formula, $ABX_3$ discussed above.

The emitter-base subcell 30 and absorber-base 70 may also be referred to by the order in which light strikes each subcell as it enters the front of the multijunction photovoltaic device 300. For instance in FIG. 3, the absorber-base subcell 70 may also be referred to as the top subcell 20, and the emitter-base subcell 30 may be referred to as the bottom subcell 60.

Subcells 30, 70 are disposed between a glass superstrate 19, which is positioned on a front side of the photovoltaic device 300, an Au or Ag mirror layer and a second contact layer 18 (e.g., p-side contact) disposed on a backside surface of the photovoltaic device 300. A transparent conductive oxide (TCO) layer 14' (e.g., $SnO_2$:F) is disposed between absorber-base subcell 70 and glass superstrate 19. A first contact layer 14 (e.g., an n-side contact) formed from, for example, Ag is in electrical communication with the TCO layer 14'. A p+ GaAs contact layer 18' and an $Al_2O_3/SiO_2$ passivation layer 18" is disposed between the second contact layer 18 (e.g., p-side contact) and the emitter-base subcell 30. The absorber-base subcell 70 comprising a perovskite further includes a buffer layer 76 (e.g., $TiO_2$) and a p-AlGaAs base layer 74 on opposing sides of the absorber layer 73, wherein the absorber layer 73 comprises the perovskite.

The GaAs emitter-base subcell 30 further includes an n-GaInP based window layer 31 and a GaAs based emitter semiconductor layer 32 disposed between the base semiconductor layer 34 and the window layer 31. Emitter-base subcell 30 further includes a BSF layer 35 comprising p-AlGaInP disposed between the base semiconductor layer 34 and the contact 18' and passivation layer 18".

Tunnel junction 27 connects the top subcell 20 and the bottom subcell 60 in electrical series. Photogenerated current leaves the respective subcell through contacting layers, which are typically doped semiconductor layers, but may be composed of other types of conductive material, such as conductive oxides, metals or metal alloys which may be transparent or opaque over different wavelength ranges. The contacting layers for the top subcell 20 are the TCO layer 14' on the front of the top subcell 20 (which in turn is contacted by the front contact layer 14 (i.e., n-side contact) on an underside of the TCO layer 14'), and the heavily doped p-type tunnel junction layer 28 (i.e., $p^{++}$-doped side of the tunnel junction 27) on the back surface of the top subcell 20. The contacting layers for the bottom subcell 60 are heavily doped n-type tunnel junction layer 29 (i.e., $n^{++}$ doped side of the tunnel junction 27) on front of the bottom subcell 60, and the $p^+$-doped GaAs contact 18' on the back surface of the bottom subcell 60 (which in turn is contacted by the second contact layer 18 (e.g., p-side contact) on the back surface of photovoltaic device 300). These contacting layers may be unpatterned, as in the case of the second contact layer 18 (e.g., metal p-side contact) on the bottom subcell 60, TCO layer 14' contacting the top subcell's buffer layer 76, in place of a more conventional solar cell grid. The contacting layers may also be patterned, as in the case of the patterned metal n-side contact layer (e.g., front contact layer 14) to form grids of solar cells. An anti-reflection coating (not shown) can be provided on the photovoltaic device's 300 front (sunward) surface (and, for example, disposed above the TCO layer 14'), and may be typically made up of one, two, or more dielectric layers with thicknesses optimized to maximize transmission of light through the front surface over the range of wavelengths to which the PV device can be responsive.

Layers 35, 34, 32, 31, 29, 28, and 74 may comprise a single one of a III-V epitaxial structure 310. The III-V epitaxial structure 310 may be formed either upright or inverted on a growth substrate comprising GaAs, InP, GaSb, InAs, InSb, GaP, Si, SiGe, SiC, Al2O3, Mo, stainless steel, soda-lime glass, SiO2, GaN and combinations thereof. The III-V epitaxial structure 310 need not be removed from a growth substrate over which it is formed. For example, a high reflectivity structure (i.e., the passivation layer 18"), such as that shown in FIG. 3, may be replaced with an active or inactive Ge substrate over which the single one of the III-V epitaxial structure may be formed.

The layers that form the glass superstrate 19, TCO layer 14', first contact layer 14, and buffer layer 76 may be formed according to standard frontside cell processing methods known in the art as frontside structure 320. Absorber layer 73 may be crystallized between III-V epitaxial structure 310 and frontside structure 320.

Example 2—Perovskite/Si 2-Junction Device

Referring now to FIG. 4, a cross-section of an exemplary multijunction photovoltaic device 400 is presented. Similar to photovoltaic device 300, the multijunction photovoltaic device 400 includes two subcells, except that the emitter-base subcell 30 in photovoltaic device 300 is replaced by an emitter-active substrate subcell 90 comprising a base semiconductor substrate 94 comprising Si (e.g., a p-type wafer) in photovoltaic device 400.

As with the subcells of photovoltaic device 300, the subcells 90, 70 in photovoltaic device 400 may also be referred to by the order in which light strikes each subcell as it enters the front thereof. For instance in FIG. 4, the absorber-base subcell 70 may also be referred to as the top subcell 20, and the emitter-active substrate subcell 90 may be referred to as the bottom subcell 60.

Subcells 90, 70 are disposed between glass superstrate 19, which is positioned on a frontside of the photovoltaic device 400, and second contact layer 18 (e.g., p-side contact), which is disposed on a backside surface of the photovoltaic device 400. A TCO layer 14' is disposed between absorber-base subcell 70 and glass superstrate 19. The front contact layer 14 (i.e., n-side contact) is in electrical communication with the TCO layer 14'. Emitter-active substrate subcell 90 may be configured as an n-on-p subcell formed with a nucleation layer 97 comprising GaP and a n-type diffusion emitter formed between base semiconductor substrate 94 and a GaAsP graded buffer layer for buffer layer 96. The GaASP graded buffer layer may be omitted if tunnel junction behavior exists at the GaP lattice constant. A backside of the emitter-active substrate subcell 90 may include an $Al_2O_3$ passivation layer (not shown) disposed between the second contact layer 18 (e.g, p-side contact) and the emitter-active substrate subcell 90.

Example 3—Perovskite/GaAs 2-Junction Device

FIG. 5 is a cross-sectional illustration of an exemplary multijunction photovoltaic device 500. Similar to photovoltaic device 300, the multijunction photovoltaic device 500 includes two subcells: emitter-base subcell 30 and absorber-base subcell 70, connected in electrical series. The emitter-base subcell 30 of photovoltaic device 500 may comprise an n-on-p GaAs subcell with semiconductor base 34 comprising p-GaAs, emitter semiconductor layer 32 comprising n-GaAs, window layer 31 comprising n-GaInP and BSF layer 35 comprising p-AlGaInP. Further photovoltaic device 500 may comprise a backside structure between the second contact layer 18 (i.e., p-side contact) and bottom subcell 60 (i.e., emitter-base subcell 30). The backside structure may comprise a similar structure as emitter active-substrate subcell 90 in FIG. 4, except that a buffer layer 96 is not present and the substrate is inactive. Thus, the backside structure in FIG. 5 may comprise an inactive substrate (e.g., n-type Ge), a nucleation layer 97 (e.g., GaP) and a GaAsP graded buffer layer as buffer layer 96. A second tunnel junction with a $p^{++}$-doped side 48 and an $n^{++}$-doped side 49 may be formed between bottom subcell 60 and the buffer 95 of the backside structure.

Example 4—Perovskite/GaAs/Ge 3-Junction Device

FIG. 6 is a cross-sectional illustration of an exemplary multijunction photovoltaic device 600. Similar to photovoltaic device 500, the multijunction photovoltaic device 600 includes emitter-base subcell 30 and absorber-base subcell 70, connected in electrical series, and a backside structure. However, instead of an inactive backside structure with an n-type Ge substrate as in photovoltaic device 500, the backside structure of photovoltaic device 600 comprises a p-type Ge active substrate. Accordingly, photovoltaic device 600 includes a third subcell, an emitter-active substrate subcell 90, as a bottom subcell 60 connected in electrical series with emitter-base subcell 30 positioned as a middle subcell 40.

Example 5—GaInP/Perovskite 2-Junction Device

Referring now to FIG. 7, a cross-section of an exemplary multijunction photovoltaic device 700 is presented. The multijunction photovoltaic device 700 includes two subcells—emitter-base subcell 30 comprising a p-GaInP base semiconductor layer 34, and emitter-absorber subcell 50 comprising a perovskite based absorber layer 53. As with the photovoltaic devices 300-600 described above, the perovskite may be any of the perovskite materials disclosed herein as represented by formula, $ABX_3$ described above.

Here, emitter-base subcell 30 is positioned as a top subcell 20, and emitter-absorber subcell 50 is positioned as bottom subcell 60. Subcells 30 and 50 are connected in series and are disposed between a glass superstrate 19, which is positioned on a front side of the photovoltaic device 700, and a second contact layer 18 (e.g., p-side contact) which may comprise Ag or AlAg and which is positioned on a backside surface of photovoltaic device 700. A tunnel junction comprised of a heavily doped p-type tunnel junction layer 28 (i.e., a $p^{++}$ doped side) and heavily doped n-type tunnel junction layer 29 (i.e., an $n^{++}$ doped side) connects the top subcell 20 and the bottom subcell 60 in electrical series. The GaInP-based emitter-base subcell 30 further includes an n-AlInP window layer 31 and an n-GaInP based emitter semiconductor layer 32 disposed between the p-GaInP base semiconductor layer 34 and the window layer 31. Emitter-base subcell 30 further includes a p-AlGaInP BSF layer 35 between the base semiconductor layer 34 and the heavily doped p-type tunnel junction layer 28 of the tunnel junction.

An n-side contact (e.g., Ag) is in electrical communication with a GaAs cap layer 15 disposed between n-AlInP window 31 of emitter-base subcell 30. An adhesive layer 17 and AR coating layer 16 are disposed between glass superstrate 19 and window layer 31 of emitter-base subcell 30. The perovskite-based emitter-absorber subcell 50 further includes an n-AlInP window layer 51 between the absorber layer 53 and heavily doped n-type tunnel junction layer 29, and an emitter semiconductor layer 52 comprising n-GaInP and disposed between absorber layer 53 and window layer 51. Hole transport material (HTM) layer 56 is disposed between the second contact layer 18 (e.g., p-side contact) and absorber layer 53. The bottom, emitter-absorber subcell 50 may further include optional transparent conductive oxide layers and/or buffer layers.

The contacting layers for the top subcell 20 are the GaAs cap layer 15 on the front of the top subcell 20 and the heavily doped p-type tunnel junction layer 28 of the tunnel junction disposed on the back surface of the top subcell 20. The contacting layers for the bottom subcell 60 are the heavily doped n-type tunnel junction layer 29 of the tunnel junction on front of the bottom subcell 60, and the second contact layer 18 (e.g., p-side contact) on the back surface of the bottom subcell 60.

Example 6—GaInP/Perovskite 2-Junction Device

FIG. 8 is a cross-sectional illustration of an exemplary multijunction photovoltaic device 800. Similar to photovoltaic device 700, the multijunction photovoltaic device 800 has two subcells, including emitter-base subcell 30 as a top subcell 20. However, instead of emitter-absorber subcell 50 positioned as a bottom subcell 60 as in photovoltaic device 700, the device 800 includes emitter-absorber-base subcell 80 as the bottom subcell 60. Accordingly, emitter-absorber-base subcell 80 as the bottom subcell 60 is connected in electrical series with emitter-absorber subcell 50 as the top subcell 20.

The subcell 80 comprises at least one absorber layer 83 comprising a perovskite which may be crystallized between III-V epitaxial layers, such as an n-GaInP emitter semiconductor layer 82 comprising, for example, n-GaInP, and a base layer 84 comprising, for example, p-GaAs or p-Al-GaAs. The subcell 80 may further include a window layer 81 disposed on the emitter 82 and comprising, for example, n-AlInP. The subcell 80 may further include BSF layer 85 comprising, for example, p-AlGaInP disposed on the base 84.

A tunnel junction comprising heavily doped p-type tunnel junction layer 28 and a heavily doped n-type tunnel junction layer 29 may be disposed between emitter-base subcell 30 and subcell 80. Device 800 may further comprise a backside structure between a second contact layer 18 (e.g., p-side contact) and the bottom subcell 60. The backside structure in FIG. 8 may comprise an inactive substrate (e.g., n-type Ge), a nucleation layer 97 (e.g., GaP) and a GaAsP graded buffer layer as buffer layer 96. A second tunnel junction with a $p^{++}$-doped side 48 and an $n^{++}$-doped side 49 may be disposed between bottom subcell 60 and the buffer 95 of the inactive backside structure.

Example 7—GaInP/Perovskite 3-Junction Device

FIG. 9 is a cross-sectional illustration of an exemplary multijunction photovoltaic device 900. Similar to device 800, the multijunction photovoltaic device 900 includes emitter-base subcell 30 as a top subcell and emitter-absorber-base subcell 80, connected in electrical series, as well as a backside structure. However, instead of an inactive backside structure with an n-type Ge substrate, as in device 800, the backside structure of device 900 comprises an emitter-active subcell 90 comprising an active base semiconductor substrate 94 comprising, for example, p-type Ge. Accordingly, device 900 includes an emitter-active substrate subcell 90 as a bottom subcell 60 connected in electrical series with emitter-absorber-base subcell 80 positioned as a middle subcell 40.

Example 8—III-V/Perovskite/Si 3-Junction Device

Referring now to FIG. 10, a cross-section of an exemplary multijunction photovoltaic device 1000 is presented. Similar to device 900, the multijunction photovoltaic device 1000 comprises a 3-junction device formed by three subcells with absorber-base subcell 70 positioned as a top subcell 20, emitter-base subcell 30 positioned as a middle subcell 40 and emitter-active substrate subcell 90 positioned as the bottom subcell 60. Here also, absorber-base subcell 70 is connected in electrical series with emitter-base subcell 30, and the emitter-active substrate subcell 90 is connected in electrical series with emitter-base subcell 30. The absorber-base subcell 70 and emitter-base subcell 30 are separated by and placed in electrical contact via a first tunnel junction comprising a heavily doped p-type tunnel junction layer 28 and a heavily doped n-type tunnel junction layer 29. The emitter-base subcell 30 and the emitter-active substrate subcell 90 are separated by and placed in electrical contact via a second tunnel junction comprising a $p^{++}$-doped side 48 and an $n^{++}$-doped side 49. However, instead of having an active germanium substrate in the bottom subcell as in device 900, the emitter-active substrate subcell 90 in multijunction photovoltaic device 1000 comprises a III-V epitaxial structure formed on an active Si substrate (e.g., p-type silicon) as the base semiconductor substrate 94. The epitaxial structure of the emitter active-substrate subcell 90 includes an emitter semiconductor layer 92 (e.g., n-type), a GaP nucleation layer 97 disposed on the emitter semiconductor layer 92, and a GaAsP graded buffer layer as buffer layer 96, which is optional if sufficient tunnel junction can be made at GaP lattice constant.

It is noted that while the examples represented by the photovoltaic devices 300-1000 are in some instances described above with respect to specific materials, the examples are not so limited. One of ordinary skill will understand that different materials or combinations of materials may be implemented in the layers of the subcells of a multijunction photovoltaic device without departing from the scope of the present disclosure.

With respect to photovoltaic devices 300-1000, perovskite absorber layer 53 may be epitaxially grown on HTM layer 56, and perovskite absorber layers 73, 83 may be epitaxially grown on corresponding base layers 74, 84, respectively, according to any useful method.

The photovoltaic devices 300-1000 of FIGS. 3-10 may each be generally described as a multijunction photovoltaic device comprising at least one layer that comprises an organometallic halide ionic solid perovskite semiconductor material and at least one layer that comprises a Group III-V semiconductor material. To form such a structure, in an example, the at least one layer comprising the organometallic halide ionic solid perovskite semiconductor material may be epitaxially grown on a layer comprising a Group III-V semiconductor material. This may be the case when forming the perovskite layer in one of the subcells, such as absorber-base subcell 70 as in the photovoltaic devices 300-600 of FIGS. 3-6 or in subcell 80 as in the photovoltaic devices 800-1000 of FIGS. 8-10. In such implementations, the at least one layer comprising the Group III-V semiconductor material may be a first layer comprising a first Group III-V semiconductor material and a second layer comprising a second Group III-V semiconductor material. For example, the first layer comprising the first Group III-V semiconductor material may be a layer of a first subcell, such as base semiconductor layer 34 of emitter-base subcell 30 in photovoltaic devices 300, 500, 600, 700, 800, 900 and 100 of FIGS. 3, 5, 6, 7, 8, 9, and 10, respectively, or such as (graded) buffer layer 96 and/or nucleation layer 97 of emitter-active substrate subcell 90 in photovoltaic device 400 of FIG. 4. Meanwhile, the at least one layer comprising the organometallic halide ionic solid perovskite semiconductor material may comprise an absorber layer of a second subcell such as absorber layer 53 of emitter-absorber subcell 50 in photovoltaic device 700 of FIG. 7, absorber layer 73 of absorber-base subcell 70 in photovoltaic devices 300-600 of FIGS. 3-6, or absorber layer 83 of subcell 80 in photovoltaic devices 800-1000 in FIGS. 8-10. In such a second subcell, the at least one layer comprising the organometallic halide ionic solid perovskite semiconductor material is disposed on the second layer comprising the second Group III-V semiconductor material second layer comprising the second Group III-V semiconductor material. Accordingly, the second layer comprising the second Group III-V semiconductor material may be the emitter semiconductor layer 52 of emitter-absorber subcell 50 in photovoltaic device 700 of FIG. 7, emitter semiconductor layer 32 of emitter-base subcell 30 in photovoltaic devices 300-600 of FIGS. 3-6, or emitter semiconductor layer 82 of subcell 80 in photovoltaic devices 800-1000 in FIGS. 8-10.

As described above, the at least one layer comprising the organometallic halide ionic solid perovskite semiconductor material may be epitaxially grown on a substrate or another layer using known methods. In an example, the layer on which the organometallic halide ionic solid perovskite semiconductor material may be epitaxially grown is a layer comprising a Group III-V semiconductor material.

Figure 11:
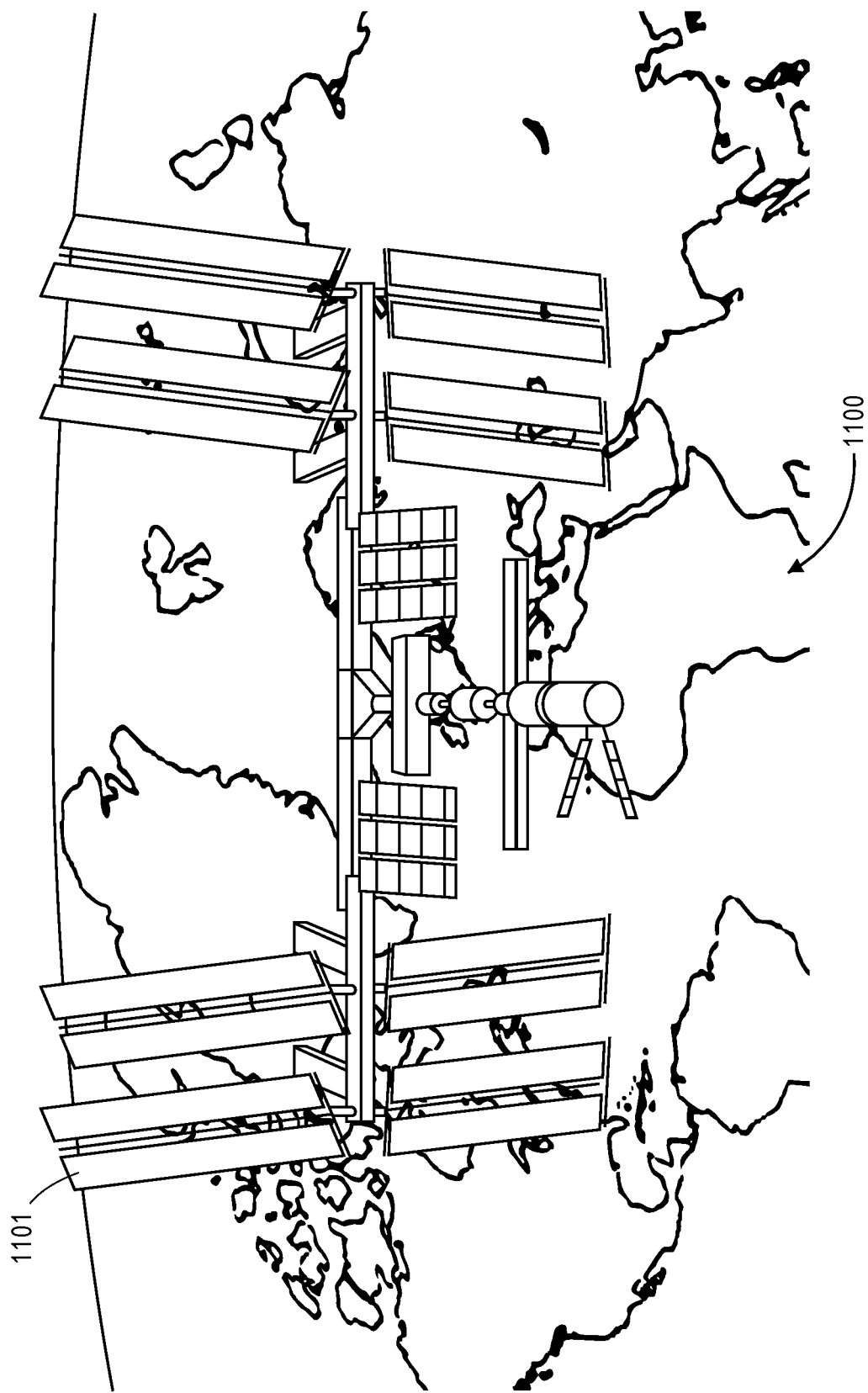
FIG. 11 is a diagram of the International Space Station (ISS) which may employ the disclosed multijunction photovoltaic device(s).

In yet a further implementation, an article may comprise a solar cell array. The article may be a vehicle, such as sea, land, air or space vehicle, or may be a satellite system. The solar cell array may be operably coupled to the article. In one such example, the article is a satellite. In one example, the article is the international space station (ISS) 1100 as shown in FIG. 11 and a solar cell array 1101 is operably coupled to the international space station. The solar cell array 1101 may comprise at least one photovoltaic device that includes a Group III-V material layer, and at least one perovskite material layer, wherein the Group III-V material layer may be a layer in a first subcell and the at least one perovskite material layer may be a layer in a second subcell. Alternatively, the Group III-V material layer and the at least one perovskite material layer may be layers in a single subcell of a multijunction photovoltaic device comprising a plurality of subcells. For example, the solar cell array 1101 may comprise at least one photovoltaic device 300-1000 as described above for FIGS. 3-10, respectively.

While the examples have been illustrated respect to one or more implementations, alterations and/or modifications can be made to the illustrated examples without departing from the spirit and scope of the appended claims. In addition, while a particular feature of the examples may have been disclosed with respect to only one of several implementations, such feature may be combined with one or more other features of the other implementations as may be desired and advantageous for any given or particular function.

Other examples will be apparent to those skilled in the art from consideration of the specification and practice of the descriptions disclosed herein. It is intended that the specification and examples be considered as exemplary only, with a true scope and spirit of the examples being indicated by the following claims.

What is claimed is:

1. A multijunction photovoltaic device, comprising:
   a first subcell comprising a base semiconductor layer and a second semiconductor layer, wherein the base semiconductor layer comprises a first Group III-V semiconductor material, and
   a second subcell comprising an absorber layer and one or both of a second subcell emitter comprising a second Group III-V semiconductor material and a second subcell base comprising a third Group III-V semiconductor material, wherein the absorber layer comprises an organometallic halide ionic solid perovskite semiconductor material.

2. The multijunction photovoltaic device of claim 1, wherein the organometallic halide ionic solid perovskite semiconductor material is represented by the formula, $ABX_3$, where A comprises methylammonium (MA), formamidine (FA), cesium (Cs, rubidium (Rb) or combinations thereof; B comprises Pb, Sn, or a combination thereof; and X comprises a halide ion.

3. The multijunction photovoltaic device of claim 1, wherein the organometallic halide ionic solid perovskite semiconductor material comprises methylammonium lead iodide ($CH_3NH_3PbI_3$).

4. The multijunction photovoltaic device of claim 1, wherein the organometallic halide ionic solid perovskite comprises a bandgap of from about 1.2 eV to about 2.0 eV.

5. The multijunction photovoltaic device of claim 4, wherein the organometallic halide ionic solid perovskite comprises a first bandgap of from about 1.2 eV to about 1.6 eV.

6. The multijunction photovoltaic device of claim 4, wherein the organometallic halide ionic solid perovskite comprises a first bandgap of from about 1.7 eV to about 2.0 eV.

7. The multijunction photovoltaic device of claim 1, wherein the first Group III-V semiconductor material comprises GaInP, GaAs, GaInAs, or InP.

8. The multijunction photovoltaic device of claim 1, wherein the second semiconductor layer comprises an emitter semiconductor layer.

9. The multijunction photovoltaic device of claim 8, wherein the base semiconductor layer comprises substantially the same chemical composition as the emitter semiconductor layer.

10. The multijunction photovoltaic device of claim 1, wherein the first subcell comprises a top subcell, wherein the second subcell comprises a bottom subcell and wherein the second subcell further comprises a hole transport material layer.

11. The multijunction photovoltaic device of claim 10, wherein the organometallic halide ionic solid perovskite semiconductor material comprises a first bandgap of from about 1.2 eV to about 1.6 eV, and wherein a bandgap of the base semiconductor is larger than the first bandgap.

12. The multijunction photovoltaic device of claim 1, wherein the second subcell further comprises a buffer layer and the second subcell base, wherein the organometallic halide ionic solid perovskite is disposed between the buffer layer and the second subcell base.

13. The multijunction photovoltaic device of claim 12, wherein the organometallic halide ionic solid perovskite comprises a first bandgap of from about 1.7 eV to about 2.0 eV, and wherein a bandgap of the base semiconductor layer comprises a second bandgap that is smaller than the first bandgap.

14. The multijunction photovoltaic device of claim 1 further comprising a third subcell,
    wherein the second subcell comprises a top subcell, the third subcell comprises a bottom subcell and the first subcell comprises a middle subcell disposed between the top subcell and bottom subcell, and
    wherein the third subcell comprises a germanium substrate.

15. The multijunction photovoltaic device of claim 14, wherein the organometallic halide ionic solid perovskite comprises a first bandgap, and wherein a bandgap of the base semiconductor layer comprises a bandgap that is larger than the first bandgap.

16. The multijunction photovoltaic device of claim 15, wherein the base semiconductor layer comprises a bandgap of from about 1.8 eV to about 1.9 eV, and wherein the first bandgap comprises from about 1.2 eV to about 1.6 eV.

17. The multijunction photovoltaic device of claim 1, wherein the organometallic halide ionic solid perovskite semiconductor material comprises MAPbI3-xClx, MAPbI3, or MASnI3.

18. The multijunction photovoltaic device of claim 1, wherein the first subcell comprises a top subcell, wherein the second subcell comprises a bottom subcell, and wherein the III-V semiconductor material of the first subcell is tuned to absorb at ultraviolet (UV) wavelengths.

19. A multijunction photovoltaic device comprising:
    a first subcell comprising (i) one or both of a first subcell emitter comprising a first Group III-V semiconductor material and a first subcell base comprising a second Group III-V semiconductor material and (ii) an absorber layer comprising an organometallic halide ionic solid perovskite semiconductor material represented by the formula $ABX_3$, where A comprises methylammonium (MA), formamidine (FA), cesium (Cs), rubidium (Rb) or combinations thereof; B comprises Pb, Sn, or a combination thereof; and X comprises a halide ion; and a second subcell comprising at least one device layer comprising a Group III-V semiconductor material, wherein the absorber layer is disposed on the at least one device layer comprising the third Group III-V semiconductor material.

20. The photovoltaic device of claim 19, wherein the absorber layer comprising the organometallic halide ionic solid perovskite semiconductor material is epitaxially grown on the at least one device layer comprising the third Group III-V semiconductor material.

21. A method for forming a multijunction photovoltaic device, comprising:

forming a first subcell comprising a base semiconductor layer and a second semiconductor layer, wherein the base semiconductor layer comprises a first Group III-V semiconductor material; and forming a second subcell comprising an absorber layer and one or both of a second subcell emitter comprising a second Group III-V semiconductor material and a second subcell base comprising a third Group III-V semiconductor material, wherein the absorber layer comprises an organometallic halide ionic solid perovskite semiconductor material.

* * * * *